United States Patent
Chu et al.

(10) Patent No.: US 7,521,800 B2
(45) Date of Patent: Apr. 21, 2009

(54) SOLDER PAD AND METHOD OF MAKING THE SAME

(75) Inventors: Chih-Chung Chu, Taoyuan County (TW); Shih-Tsung Lin, Taoyuan County (TW); Hsien-Chieh Lin, Taoyuan County (TW)

(73) Assignee: Nan Ya Printed Circuit Board Corporation, Luchu, Taoyuan (TW)

( * ) Notice: Subject to any disclaimer, the term of this patent is extended or adjusted under 35 U.S.C. 154(b) by 70 days.

(21) Appl. No.: 11/752,934

(22) Filed: May 24, 2007

(65) Prior Publication Data

US 2008/0251917 A1    Oct. 16, 2008

(30) Foreign Application Priority Data

Apr. 11, 2007    (TW) .............................. 96112745 A

(51) Int. Cl.
   *H01L 23/48* (2006.01)
(52) U.S. Cl. ................ 257/738; 257/779; 257/E23.021; 438/613
(58) Field of Classification Search ................ 257/737, 257/738, 779, E23.021, E21.508; 438/612–624
   See application file for complete search history.

(56) References Cited

U.S. PATENT DOCUMENTS

| | | | | |
|---|---|---|---|---|
| 6,353,420 | B1 * | 3/2002 | Chung | 343/895 |
| 6,759,319 | B2 * | 7/2004 | Viswanadam et al. | 438/613 |
| 6,908,842 | B2 * | 6/2005 | Chen et al. | 438/613 |
| 7,378,745 | B2 * | 5/2008 | Hayashi et al. | 257/778 |
| 2006/0003495 | A1 * | 1/2006 | Sunohara et al. | 438/124 |
| 2007/0152350 | A1 * | 7/2007 | Kim et al. | 257/786 |
| 2007/0207607 | A1 * | 9/2007 | Lee | 438/613 |
| 2007/0237890 | A1 * | 10/2007 | Sakai et al. | 427/98.4 |

* cited by examiner

*Primary Examiner*—Tuan N. Quach
(74) *Attorney, Agent, or Firm*—Winston Hsu

(57) ABSTRACT

A solder pad structure includes a first metal layer disposed on an insulation layer, wherein the first metal layer is electrically connected with an underlying interconnection circuit layer through a conductive through hole disposed in the insulation layer. A solder resist layer having an opening exposing a central portion of the first metal layer is disposed on the insulating layer. A pillar-shaped second metal layer is disposed within the opening directly on the first metal layer. A solder ball filled into the opening is in contact with the pillar-shaped second metal layer.

19 Claims, 26 Drawing Sheets

SOLDER PAD AND METHOD OF MAKING THE SAME

BACKGROUND OF THE INVENTION

1. Field of the Invention

The present invention relates generally to the field of packaging substrate. More particularly, the present invention relates to a solder pad structure provided on the chip side of a packaging substrate and fabrication method thereof, which is capable of improving solder joint reliability of the solder ball.

2. Description of the Prior Art

The current trend toward lighter, thinner and smaller electronic products has driven the market to pay more attention to the flip chip packaging technology. The flip chip technology has several advantages over the conventional packaging approaches and has thus become the mainstream in the packaging and testing industry. As the high-level ball type packaging such as ball grid array (BGA) or flip chip is widely employed, the demand for the packaging substrate thereof is increased.

The trace or circuit on the surface of the packaging substrate has become denser and denser. It is a major challenge to improve the stability, reliability and yield of both the product and the fabrication process, reduce the cost, and concurrently increase the trace density of the packaging substrate.

As known in the art, the back end process of fabricating the packaging substrate includes solder printing on the solder pads and thermal re-flow process (to form solder balls). The aforesaid solder pads are exposed by corresponding openings, which are also referred to as solder resist openings or S/R openings, formed in the surface insulation layer, i.e., solder resist layer.

As the trace density becomes denser, the dimension of the S/R opening shrinks. The amount of solder paste squeezed into the shrunk S/R opening becomes inadequate and can not contact with the solder pad at the bottom of the S/R opening. This results in defects such as falling out or contact failure of the solder ball during or after the re-flow process. The shrinkage of the S/R opening creates a test on the ability and limit of the solder paste printing process and apparatus.

Practically, the aforesaid defects such as falling out or contact failure of the solder ball often occur when the S/R opening shrinks to less than 85 micrometers and it has been known that some advanced products has S/R openings with dimension of about 60 micrometers or even less.

In light of the above, there is a strong need in this industry to provide an improved structure or method to solve the defects such as falling out or contact failure of the solder ball at the back end of the fabrication of the packaging substrate.

SUMMARY OF THE INVENTION

It is one object of the present invention to provide an improved solder pad structure in order to solve the above-mentioned problems.

According to the claimed invention, a solder pad structure is provided. The solder pad structure includes a packaging substrate comprising a base substrate, a plurality of additive metal wires; at least one insulating layer comprising therein at least one conductive through hole; a solder pad comprising a first metal layer on the insulating layer and filling into the conductive through hole, and a second metal layer stacked on the first metal layer, wherein the first and second metal layers constitute a bump structure; and a solder resist layer covering the insulating layer, the solder resist layer comprising at least one solder resist opening for exposing a portion of the solder pad.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to an improved back end process for fabricating packaging substrates. The back end process includes solder paste printing on solder pads and subsequent re-flow process to form solder balls that are firmly and steadily connected to the solder pads.

The present invention can resolve the prior art problems of small solder resist (S/R) opening and inadequate solder paste squeezed into the S/R opening. The inadequate solder paste in the S/R opening is the root cause of ball falling out and contact failure during the re-flow process. The present invention can improve the product yield.

The present invention also provides an improved solder pad structure which is capable of firmly connecting with the solder ball and prevents the prior art problems of small solder resist (S/R) opening and contact failure in the S/R opening.

Please refer to FIGS. 1-10. FIGS. 1-10 are schematic, cross-sectional diagrams illustrating the back end process for the fabrication of a packaging substrate in accordance with the first preferred embodiment of this invention.

Figure 1:
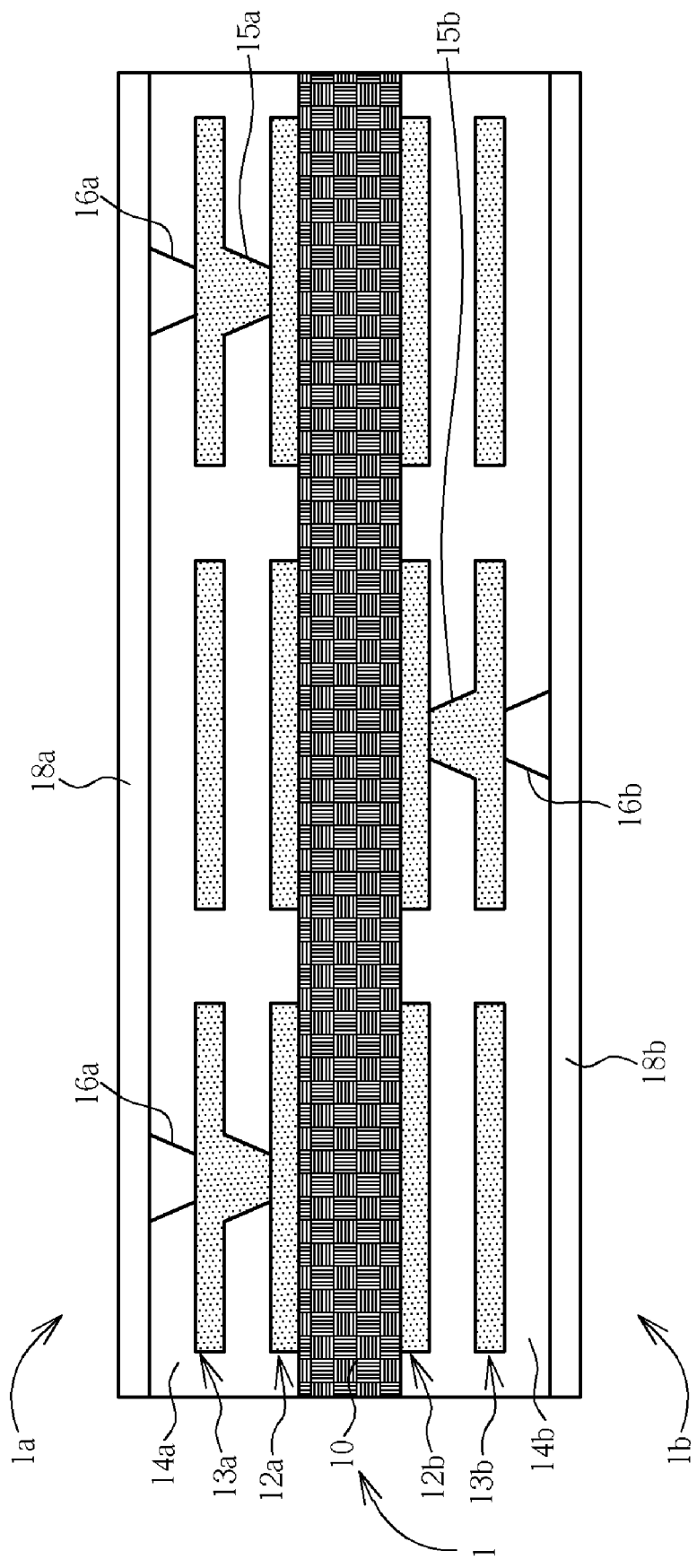
FIGS. 1-10 are schematic, cross-sectional diagrams illustrating the back end process for the fabrication of a packaging substrate in accordance with the first preferred embodiment of this invention.

As shown in FIG. 1, a packaging substrate 1 including a base substrate 10 is provided. A plurality of metal conductors 12a, 12b, 13a and 13b, and insulating layers 14a and 14b are formed on the first side 1a and second side 1b of the packaging substrate 1. The metal conductors 12a, 12b, 13a and 13b may be formed by conventional additive methods including lithography, plating, film deposition, hole drilling, etc. The metal conductors 12a and 13a are connected through the conductive through hole 15a, and the metal conductors 12b and 13b are connected through the conductive through hole 15b.

According to this invention, a semiconductor chip or die will be eventually mounted onto the first side 1a of the packaging substrate 1. Therefore, the first side 1a of the packaging substrate 1 is also referred to the chip side. The second side 1b of the packaging substrate 1 will be eventually mounted onto an external circuit board or a printed circuit board. It is the major object of the present invention to solve the problems of ball falling out or contact failure on the first side 1a of the packaging substrate 1.

It is understood that the packaging substrate 1 is for illustration purpose. The present invention is not limited to the double side substrate that has additive circuits on both sides of the substrate. The present invention is applicable to single side substrate that has additive circuits on only one side of the substrate. Besides, the present invention is not limited to the substrate that has multiple layers of additive circuits. The present invention is applicable to substrate that has single layer of additive circuit.

The insulating layers 14a and 14b may be composed of at least one layer or multiple layers of epoxy such as Ajinomoto Build-up Film (ABF), BT, and polyimide, or any other suitable thermosetting insulating materials. The through holes 16a and 16b are formed in the insulating layers 14a and 14b, respectively, by conventional drilling methods such as laser drilling methods. The through holes 16a and 16b expose portions of the underlying metal conductors 13a and 13b respectively. Solder pads will be formed directly above the through holes 16a and 16b.

Next, a first dry film lamination process is performed to cover the first side 1a and second side 1b of the packaging substrate 1 with a photoresist dry film 18a and a photoresist dry film 18b respectively. The photoresist dry film 18a and the photoresist dry film 18b are laminated on the insulating layer 14a and the insulating layer 14b respectively. Prior to the lamination of the photoresist dry films 18a and 18b, a blanket conductive layer such as chemical copper layer (not shown) may be deposited on the insulating layer 14a and the insulating layer 14b.

Figure 2:
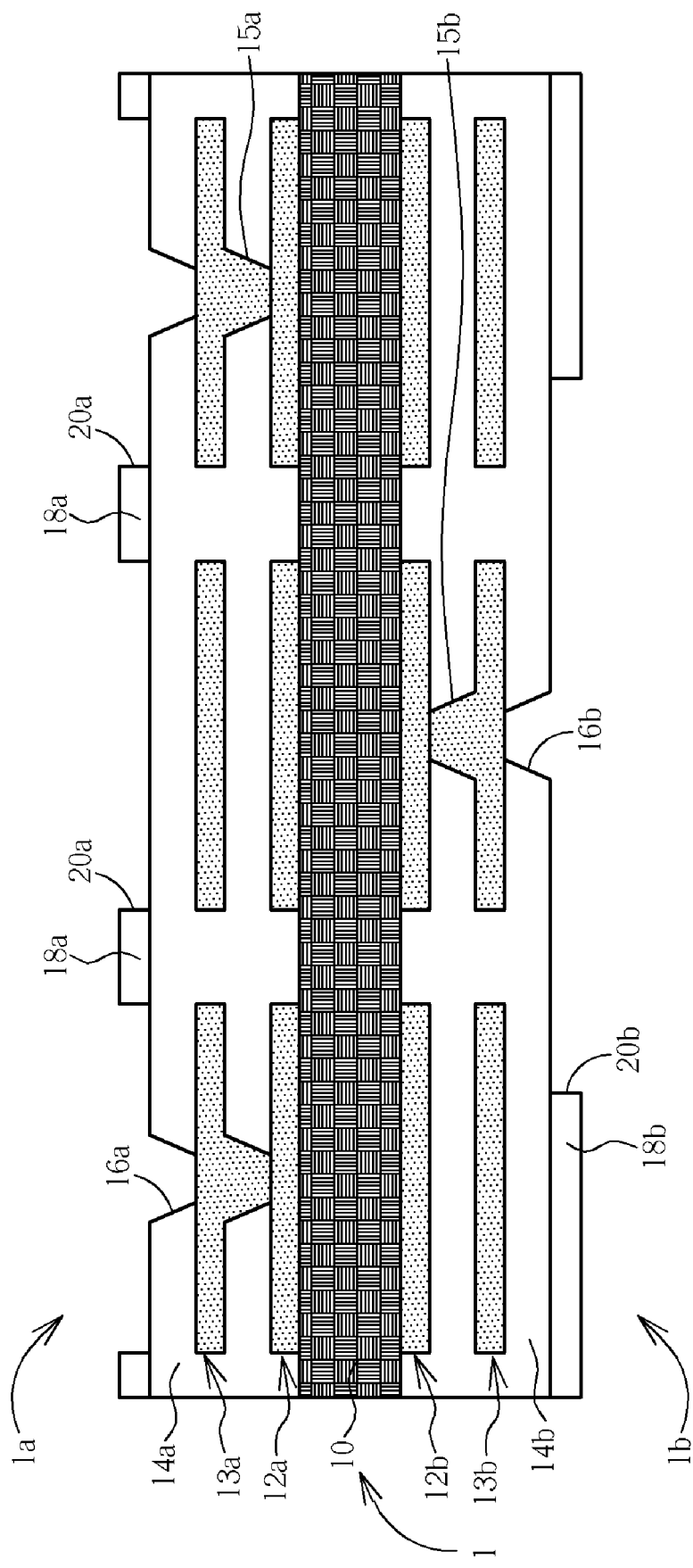

As shown in FIG. 2, an exposure and development process is carried out to form openings 20a and 20b in the photoresist dry films 18a and 18b, respectively. The opening 20a exposes the through hole 16a and the opening 20b exposes the through hole 16b. It is understood that the position of the conductive through holes are merely for illustration purpose, that is, the real conductive through hole is not necessary situated directly under the solder pad. In some cases, there is no conductive through hole directly under the solder pad.

Figure 3:
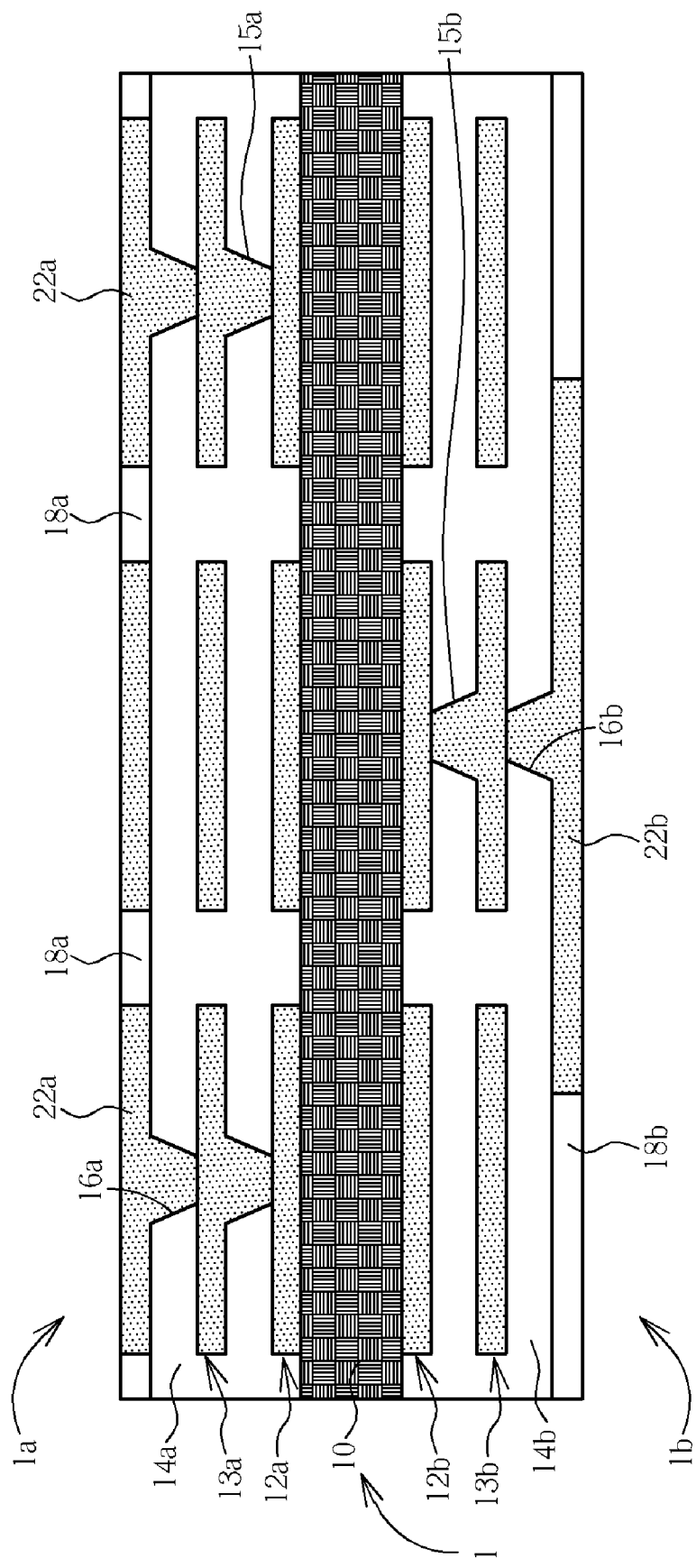

As shown in FIG. 3, an electroplating process is carried out to fill the openings 20a and 20b and the exposed through holes 16a and 16b with first metal layers 22a and 22b. The first metal layers 22a and 22b may be copper, tin, silver, lead, gold, nickel or alloys thereof, preferably copper. Thereafter, a pre-clean process is performed to wash the surfaces of the plated packaging substrate 1 with water. After drying, the packaging substrate 1 is transferred to a clean room and is subjected to second time dry film lamination process. It is noted that at this phase the photoresist dry films 18a and 18b are still on the packaging substrate 1.

Figure 4:
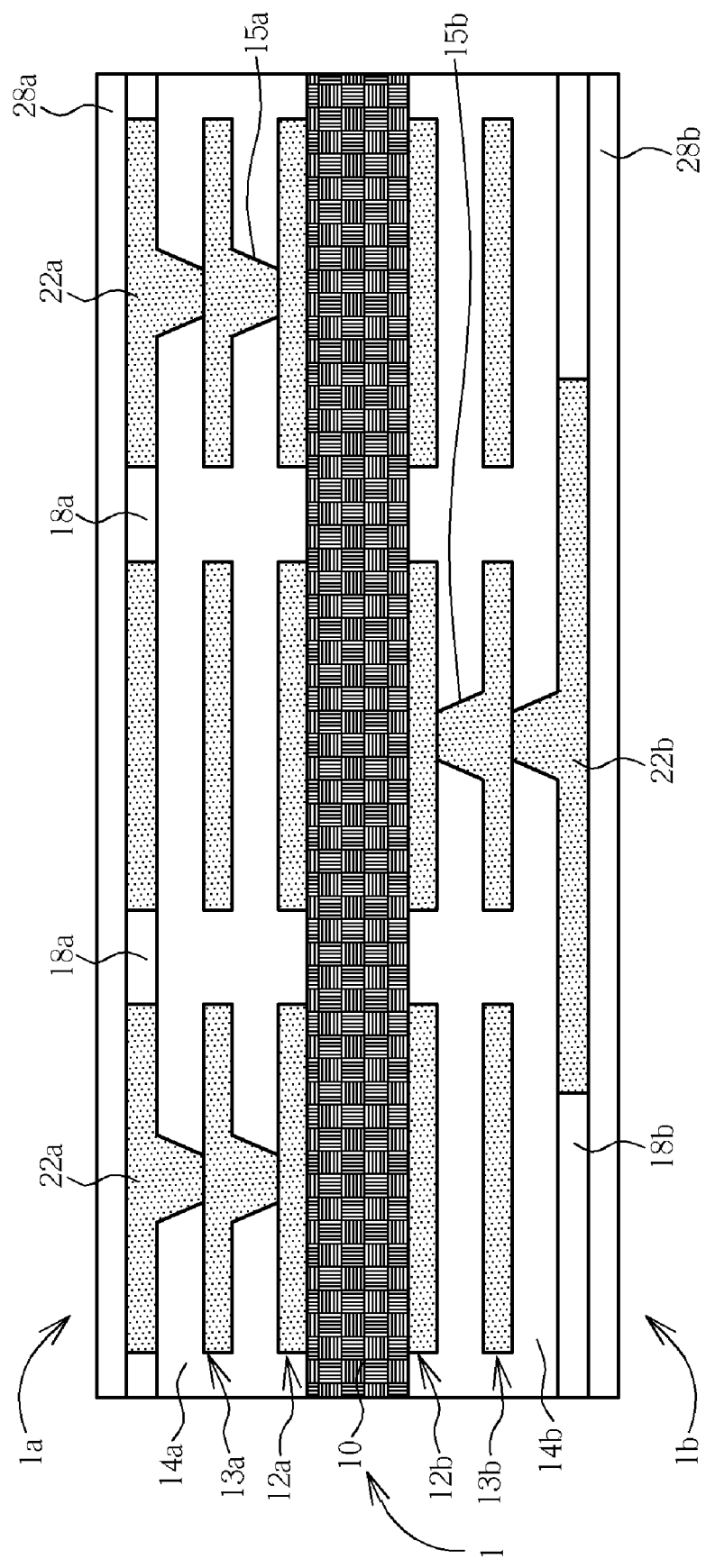

As shown in FIG. 4, subsequently, a second dry film lamination process is performed to cover the first side 1a and the second side 1b of the packaging substrate 1 with a photoresist dry films 28a and 28b respectively. The photoresist dry films 28a and 28b are directly laminated on the photoresist dry films 18a and 18b and on the first metal layers 22a and 22b, respectively.

Figure 5:
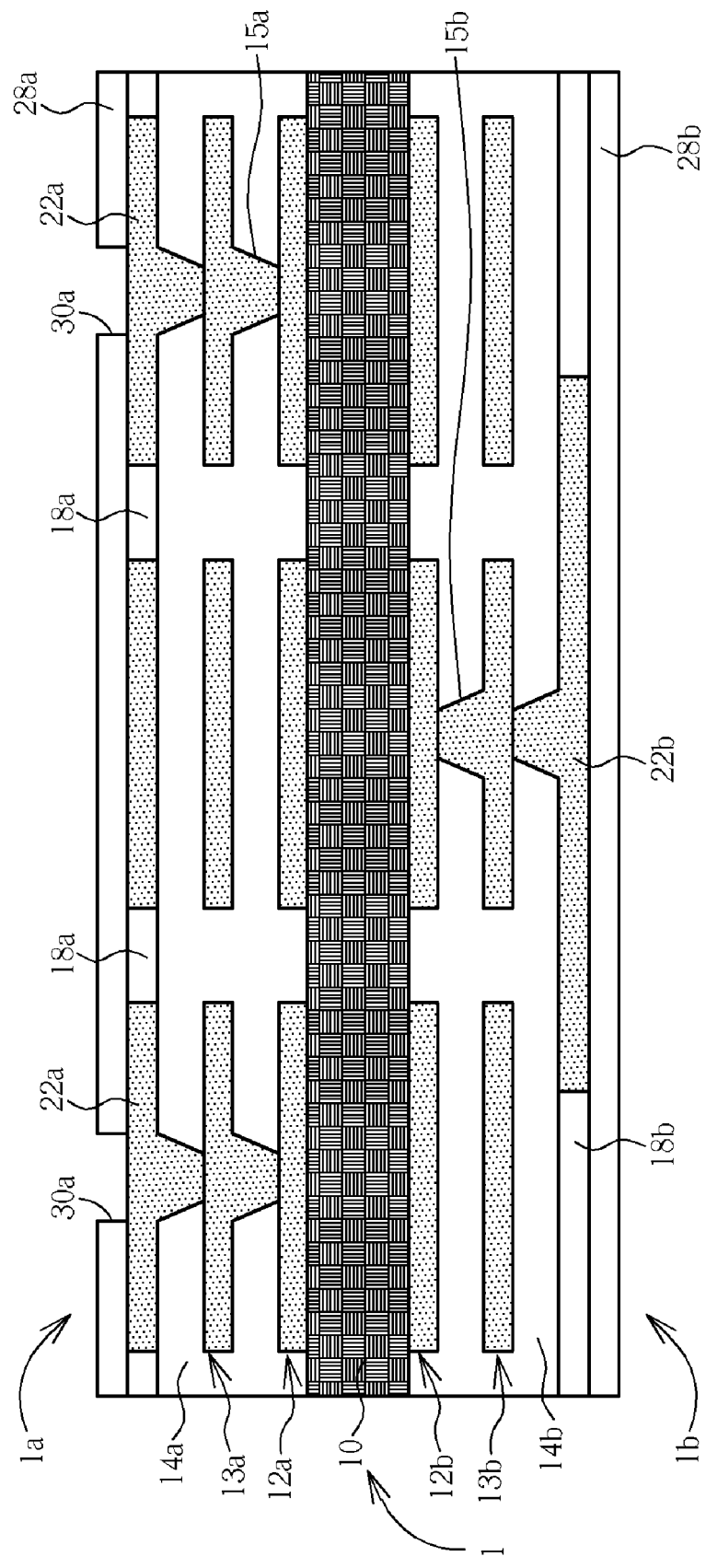

As shown in FIG. 5, a second exposure and development process is carried out to form openings 30a merely in the photoresist dry film 28a. The openings 30a is directly above the first metal layer 22a and exposes portions of the first metal layer 22a. It is noteworthy that the photoresist dry film 28b on the second side 1b of the packaging substrate 1 is deliberately not subjected to the exposure and development process.

Figure 6:
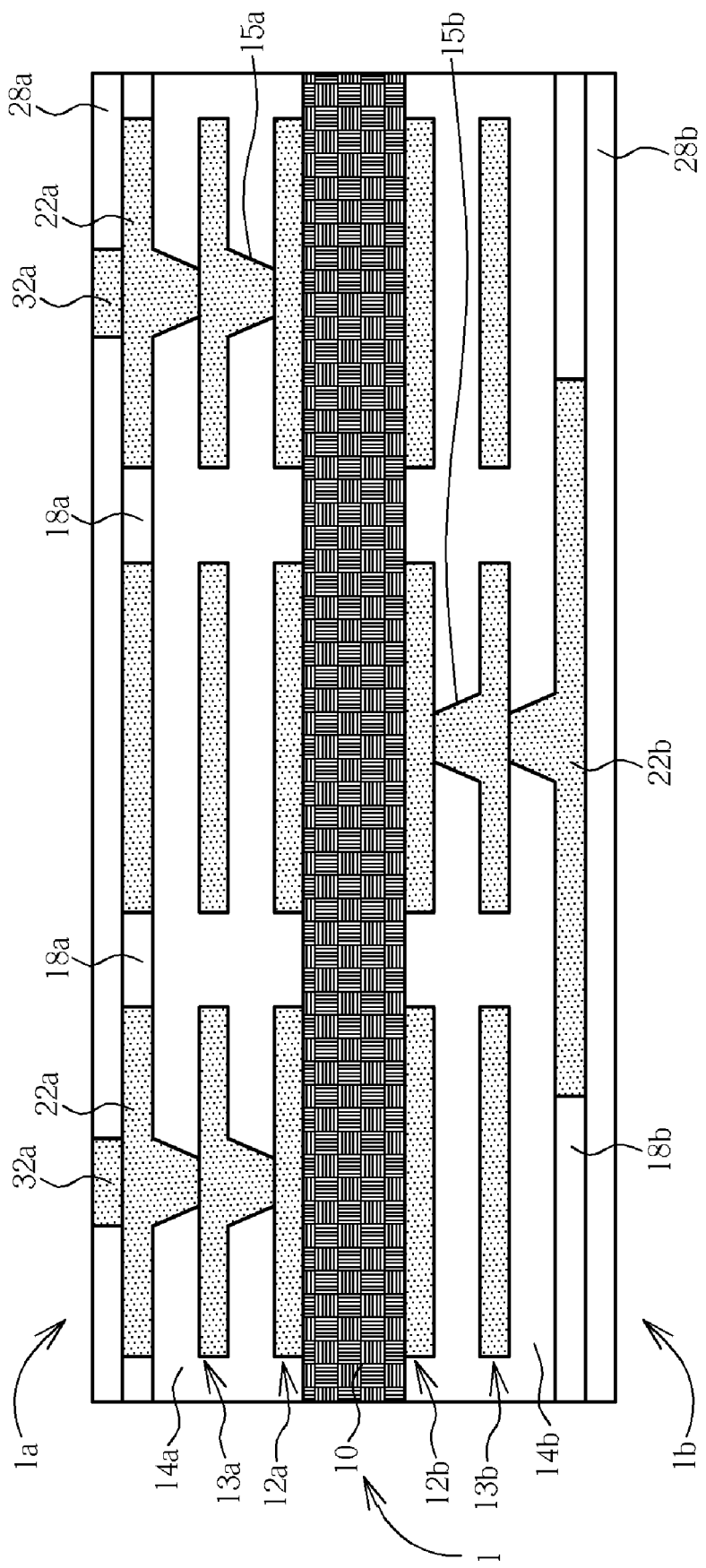

As shown in FIG. 6, another electroplating process is performed to fill the openings 30a with a second metal layer 32a, for example, copper, tin, silver, lead, gold, chrome or nickel, preferably copper. The second metal layer 32a is in direct contact with the first metal layer 22a to form a bump structure on the top surface of the first metal layer 22a. According to the preferred embodiment of this invention, the second metal layer 32a has a thickness of about 15 micrometers to 20 micrometers.

Figure 7:
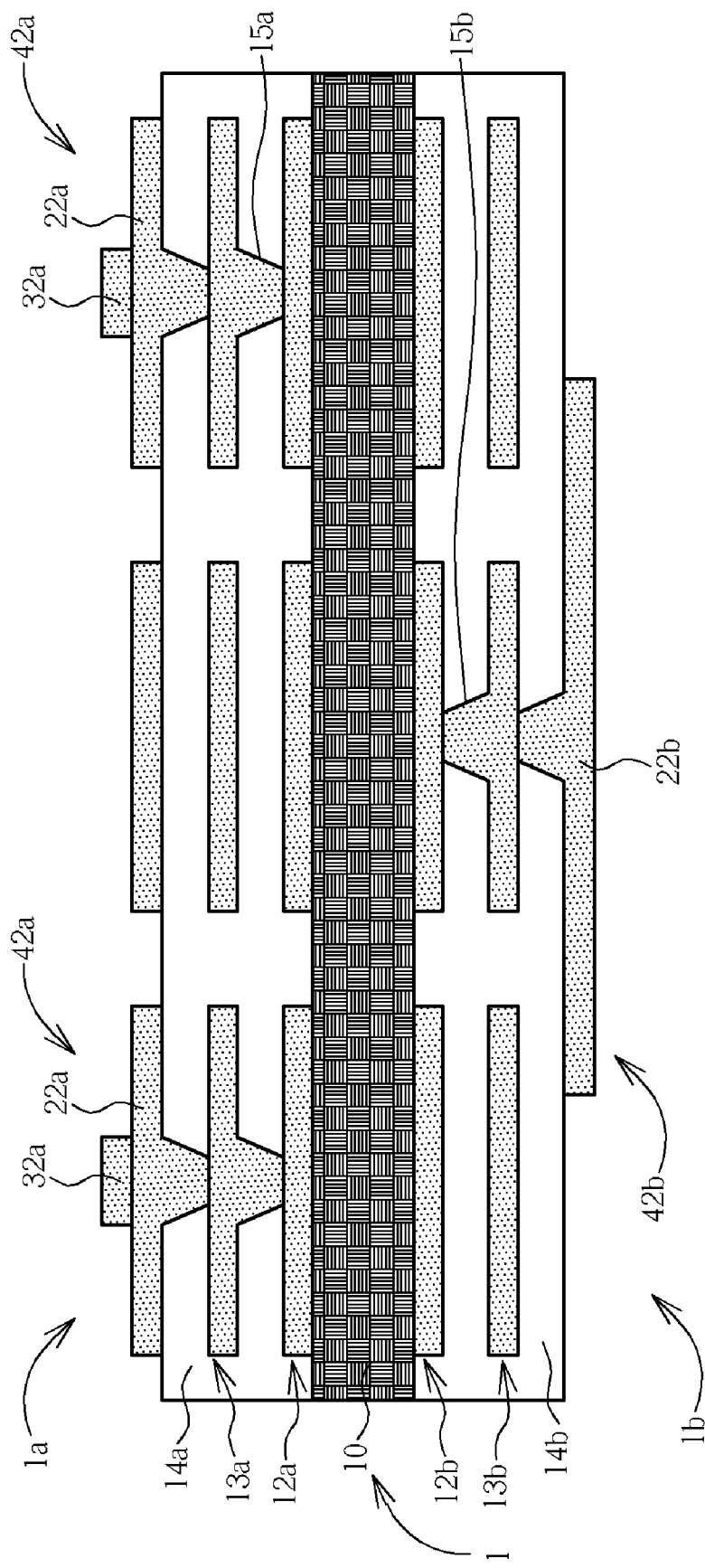

As shown in FIG. 7, after the electroplating of the second metal layer 32a, the photoresist dry films 28a and 28b and the photoresist dry films 18a and 18b are stripped off concurrently. At this point, the solder pad 42a consisting of the first metal layer 22a and the second metal layer 32a is formed on the first side 1a of the packaging substrate 1. The solder pad 42b on the second side 1b of the packaging substrate 1 only consists of the first metal layer 22b. After stripping the photoresist dry films, several post treatment steps are carried out, for example, ABF post bake, palladium removal and copper surface roughing.

Figure 8:
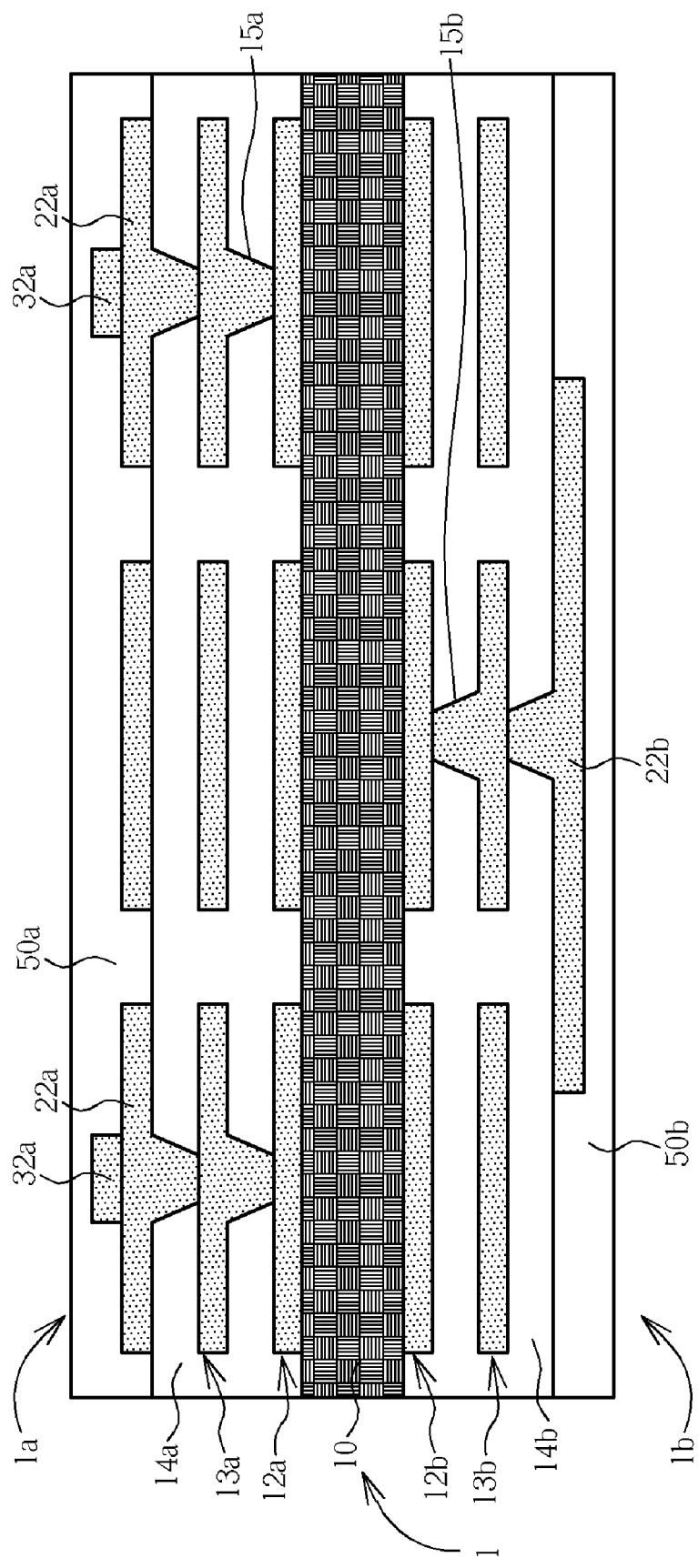

As shown in FIG. 8, a solder resist coating process is performed to coat solder resist layers 50a and 50b on the first side 1a and second side 1b of the packaging substrate 1. The solder resist layer 50a covers the first metal layer 22a and the second metal layer 32a of the solder pad 42a. The solder resist layer 50b covers the solder pad 42b. The solder resist layers 50a and 50b are composed of photosensitive materials.

Figure 9:
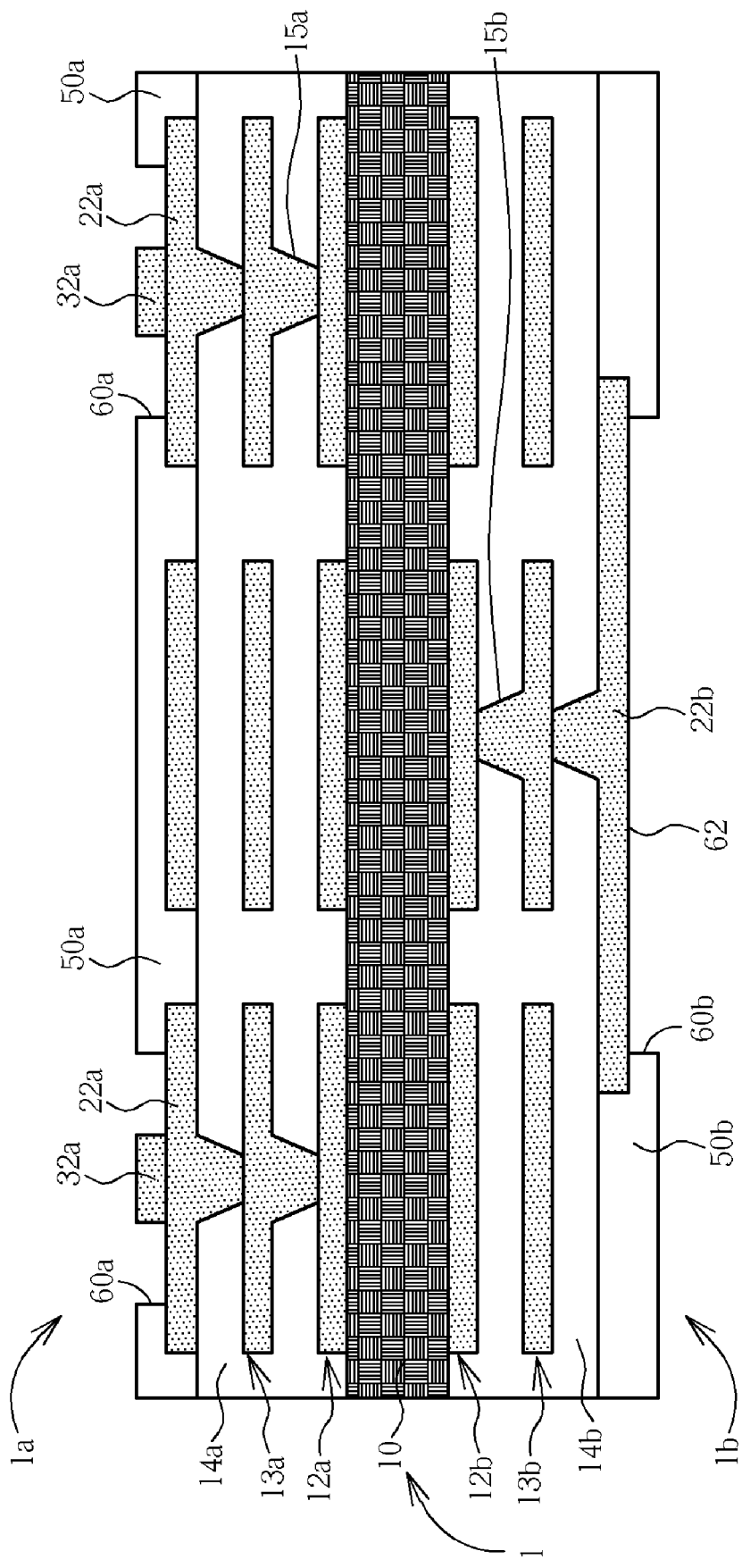

As shown in FIG. 9, the solder resist layers 50a and 50b are subjected to an exposure and development process to form S/R openings 60a and 60b in the solder resist layers 50a and 50b respectively. The S/R opening 60a is directly above the solder pad 42a and exposes the second metal layer 32a and a portion of the metal layer 22a. The S/R opening 60b exposes a portion of the solder pad 42b. The remaining treatment includes de-smear and final surface treatment.

The aforesaid final surface treatment may include deposition of material layer 62 such as chemical nickel gold, nickel silver, tin, silver or organic solder preservative (OSP) on the solder pad 42a or solder pad 42b.

Figure 10:
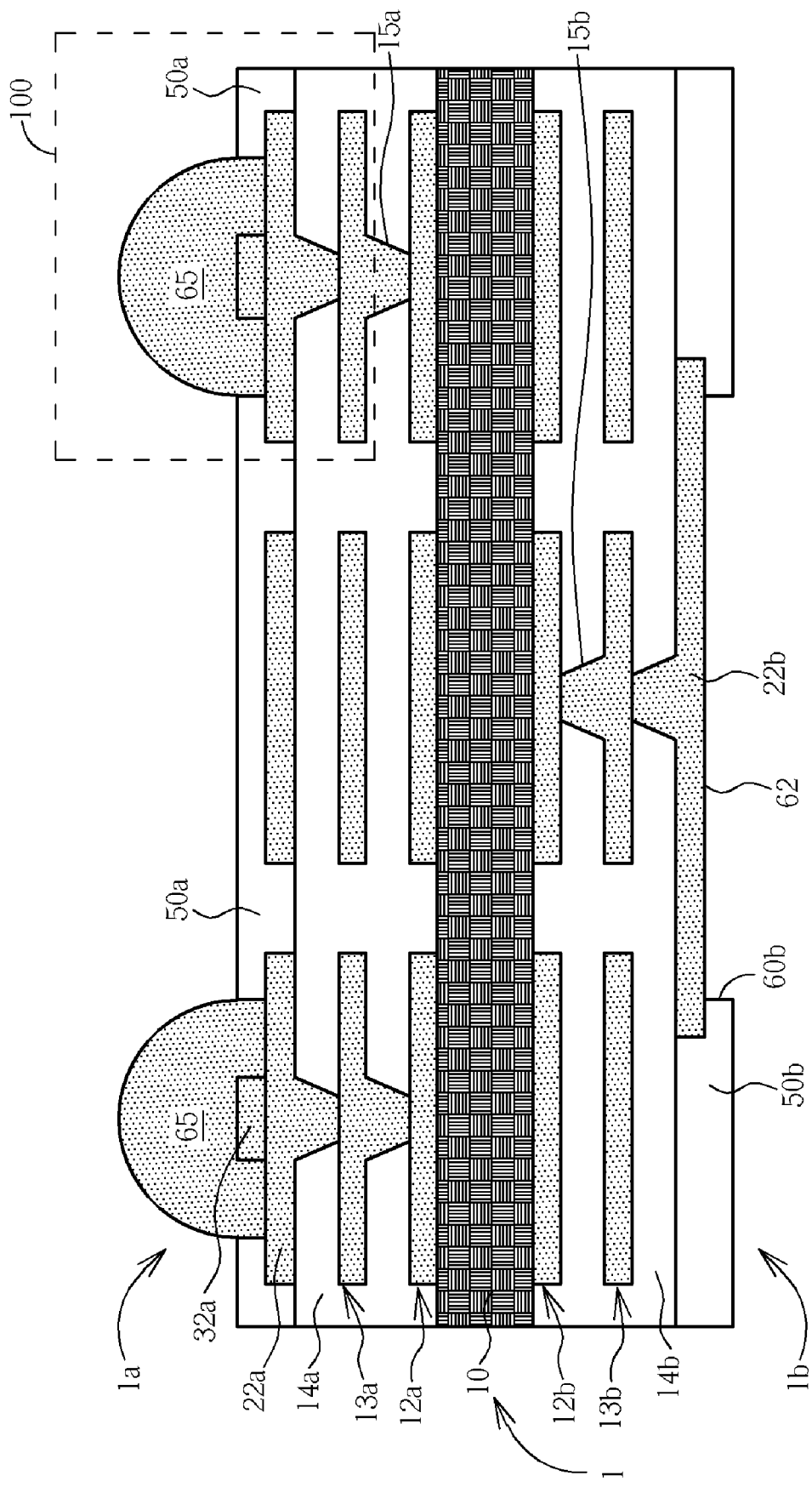

As shown in FIG. 10, a solder printing process and re-flow process are then carried out to form solder ball 65 on the solder pad 42a on the first side 1a of the packaging substrate 1.

The present invention features that the solder pad 42a can wedge and firmly stick to the overlying solder ball 65 such that the solder ball 65 does not fall out during the re-flow process. The contact area between the solder paste squeezed into the S/R opening 60a and the solder pad 42a is increased due to that the solder pad 42a has an upwardly protruding bump structure, i.e., the second metal layer 32a.

Figure 11:
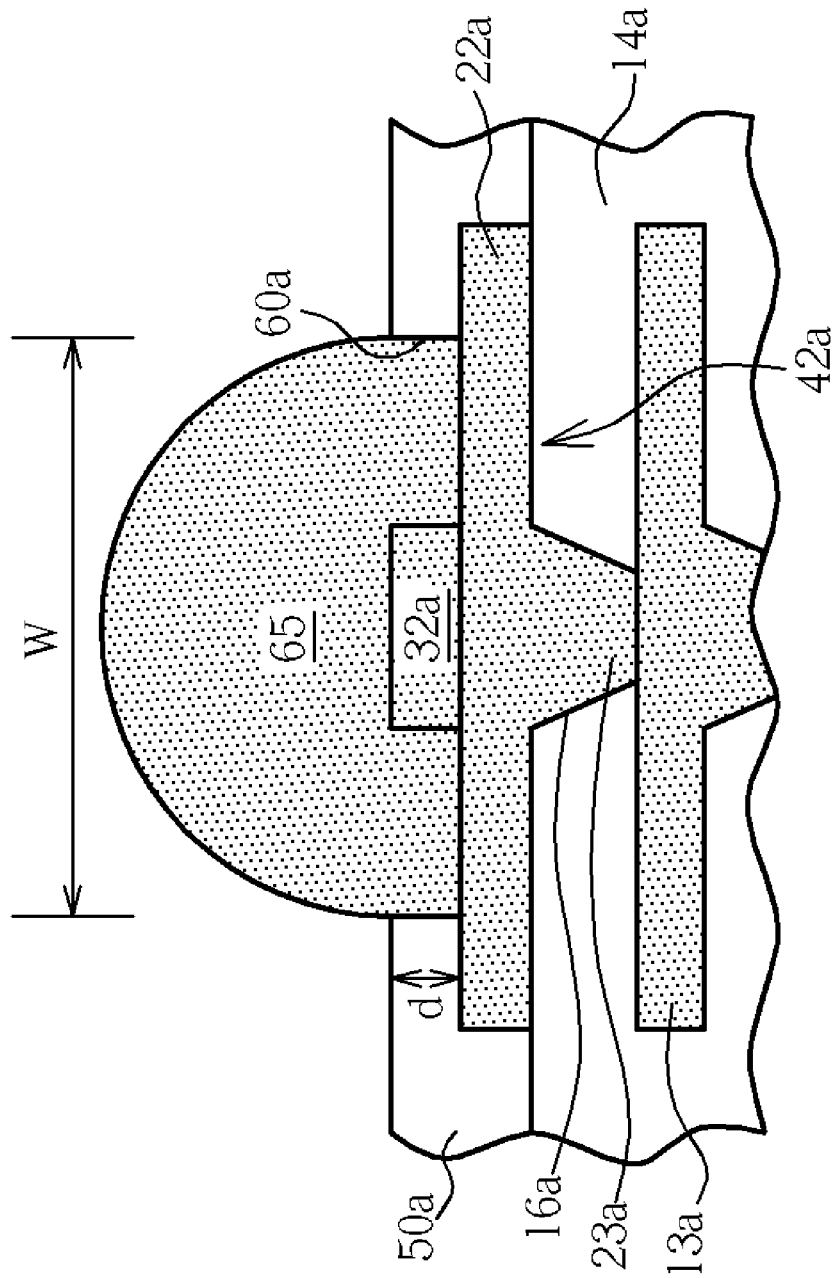
FIG. 11 is an enlarged view showing the solder pad of FIG. 10.

FIG. 11 is an enlarged view showing the solder pad 42a of FIG. 10 (indicated by the dashed line 100). As shown in FIG. 11, structurally, the solder pad 42a includes a first metal layer 22a that is electroplated concurrently with the underlying conductive through hole 23a. The first metal layer 22a is electrically connected to the metal conductor 13a through the conductive through hole 23a. The pillar-shaped second metal layer 32a is laminated on the center area of the first metal layer 22a to form a central bump structure. Depending on the customer's requirements, some conductive through holes directly under the solder pads may be omitted.

The first metal layer 22a is inlaid in the solder resist layer 50a and the vertical sidewalls of the first metal layer 22a is covered by the solder resist layer 50a. The second metal layer 32a and a portion of the top surface of the first metal layer 22a is exposed by the S/R opening 60a in the solder resist layer 50a. The S/R opening 60a is filled with the solder ball 65. According to the preferred embodiment of this invention, the second metal layer 32a has a width that is about ⅓ to ¼ of the diameter of the S/R opening 60a. A smaller second metal layer 32a can prevent misalignment during the exposure of the solder resist layer 50a and also the resist residual problem. According to the preferred embodiment of this invention, the S/R opening 60a has a depth d of about 15-35 micrometers, preferably 20-30 micrometers, and a diameter w of about 10-85 micrometers, preferably 20-70 micrometers. The second metal layer 32a has a thickness of about 10-30 micrometers, preferably 15-20 micrometers.

Figure 12:
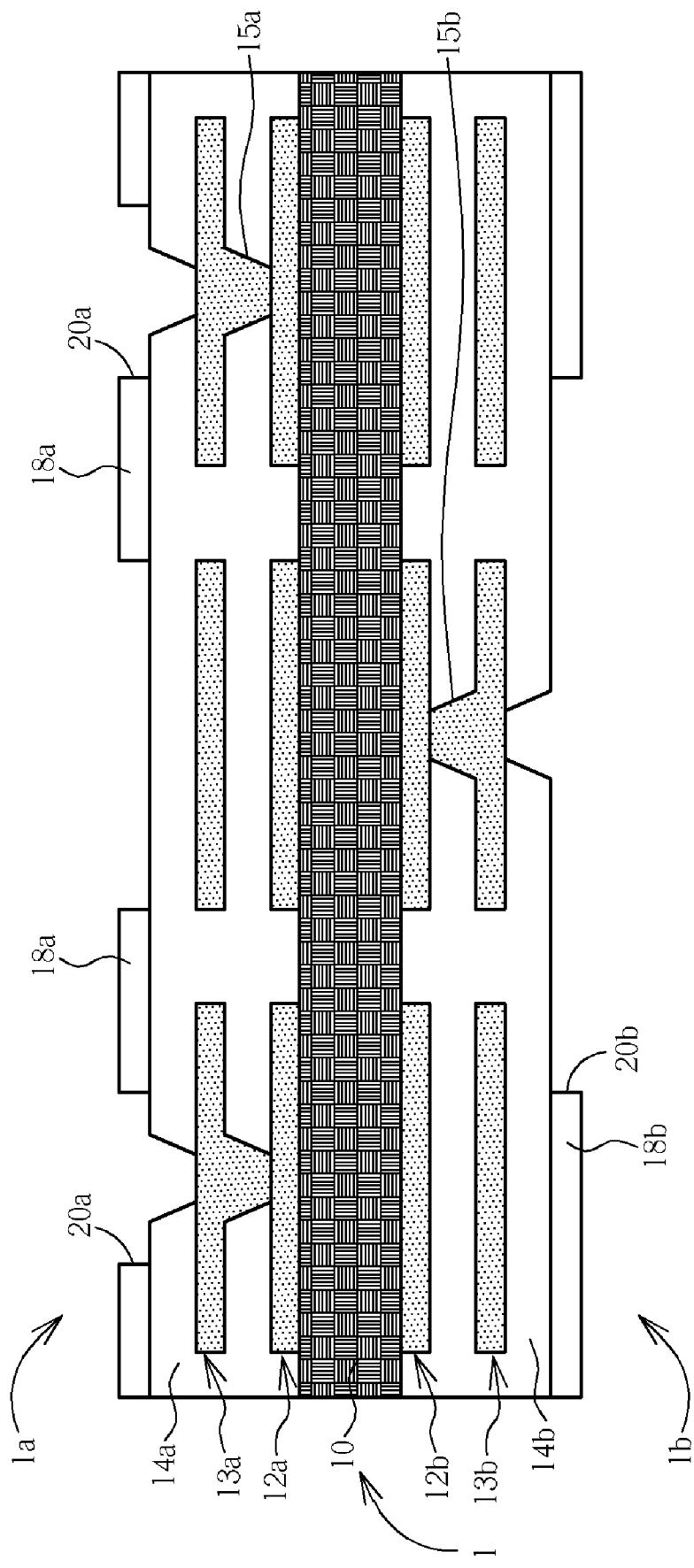
FIGS. 12-19 are schematic, cross-sectional diagrams illustrating the process for the fabrication of a packaging substrate in accordance with the second preferred embodiment of this invention.

FIGS. 12-19 are schematic, cross-sectional diagrams illustrating the process for the fabrication of a packaging substrate in accordance with the second preferred embodiment of this invention. As shown in FIG. 12, a packaging substrate 1 including a base substrate 10 is provided. Likewise, a plurality of metal conductors 12a, 12b, 13a and 13b, and insulating layers 14a and 14b are formed on the first side 1a and second side 1b of the packaging substrate 1. The metal conductors 12a, 12b, 13a and 13b may be formed by conventional additive methods including lithography, plating, film deposition, hole drilling, etc. The metal conductors 12a and 13a are connected through the conductive through hole 15a, and the metal conductors 12b and 13b are connected through the conductive through hole 15b.

The insulating layers 14a and 14b may be composed of at least one layer or multiple layers of Ajinomoto Build-up Film (ABF), BT, polyimide, or any other suitable thermosetting insulating materials. The through holes 16a and 16b are formed in the insulating layers 14a and 14b, respectively, by conventional drilling methods such as laser drilling methods. The through holes 16a and 16b expose portions of the underlying metal conductors 13a and 13b respectively. Solder pads will be formed directly above the through holes 16a and 16b.

Next, a first dry film lamination process is performed to cover the first side 1a and second side 1b of the packaging substrate 1 with a photoresist dry film 18a and a photoresist dry film 18b respectively. The photoresist dry film 18a and the photoresist dry film 18b are laminated on the insulating layer 14a and the insulating layer 14b respectively. Prior to the lamination of the photoresist dry films 18a and 18b, a blanket conductive layer such as chemical copper layer (not shown) may be deposited on the insulating layer 14a and the insulating layer 14b. An exposure and development process is carried out to form openings 20a and 20b in the photoresist dry films 18a and 18b, respectively. The opening 20a exposes the through hole 16a and the opening 20b exposes the through hole 16b.

Figure 13:
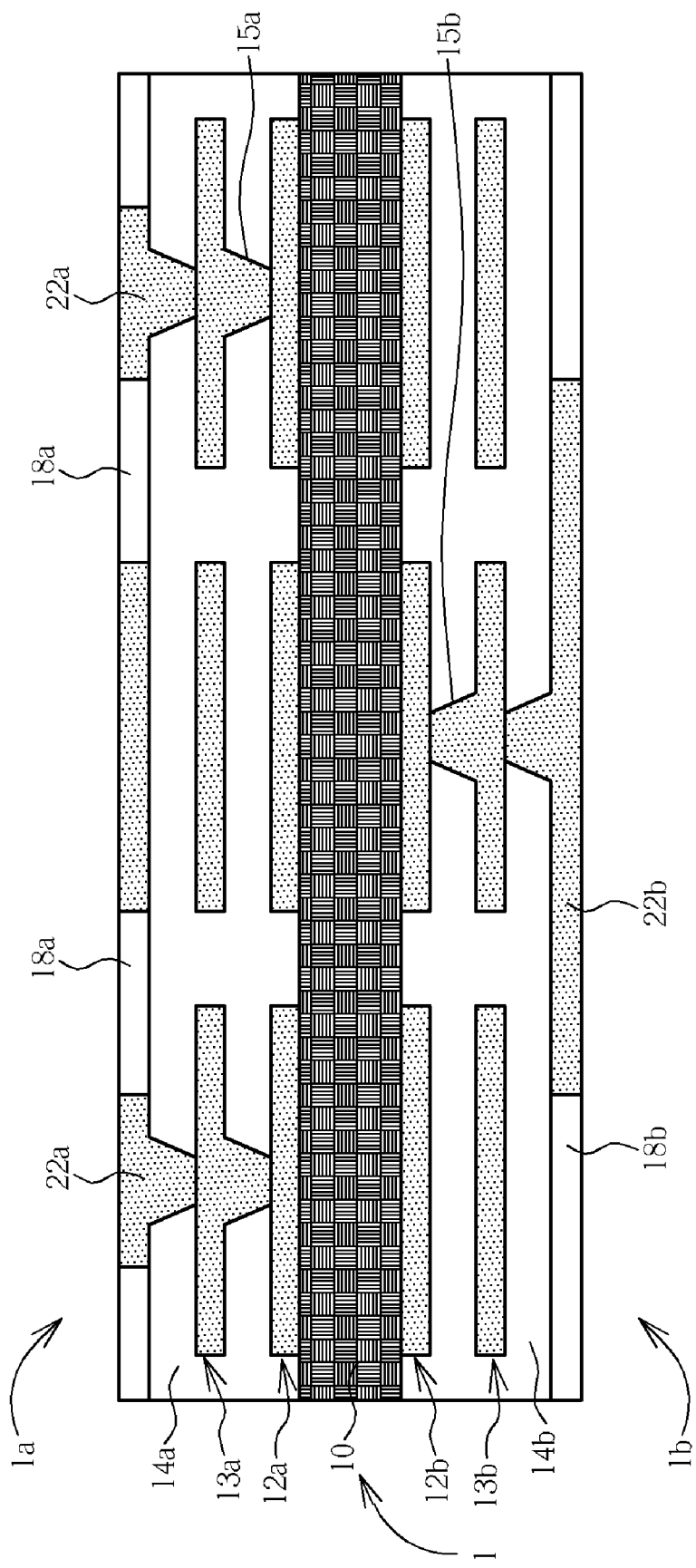

As shown in FIG. 13, an electroplating process is carried out to fill the openings 20a and 20b and the exposed through holes 16a and 16b with first metal layers 22a and 22b. The first metal layers 22a and 22b may be copper, tin, silver, lead, gold, nickel or alloys thereof, preferably copper.

Figure 14:
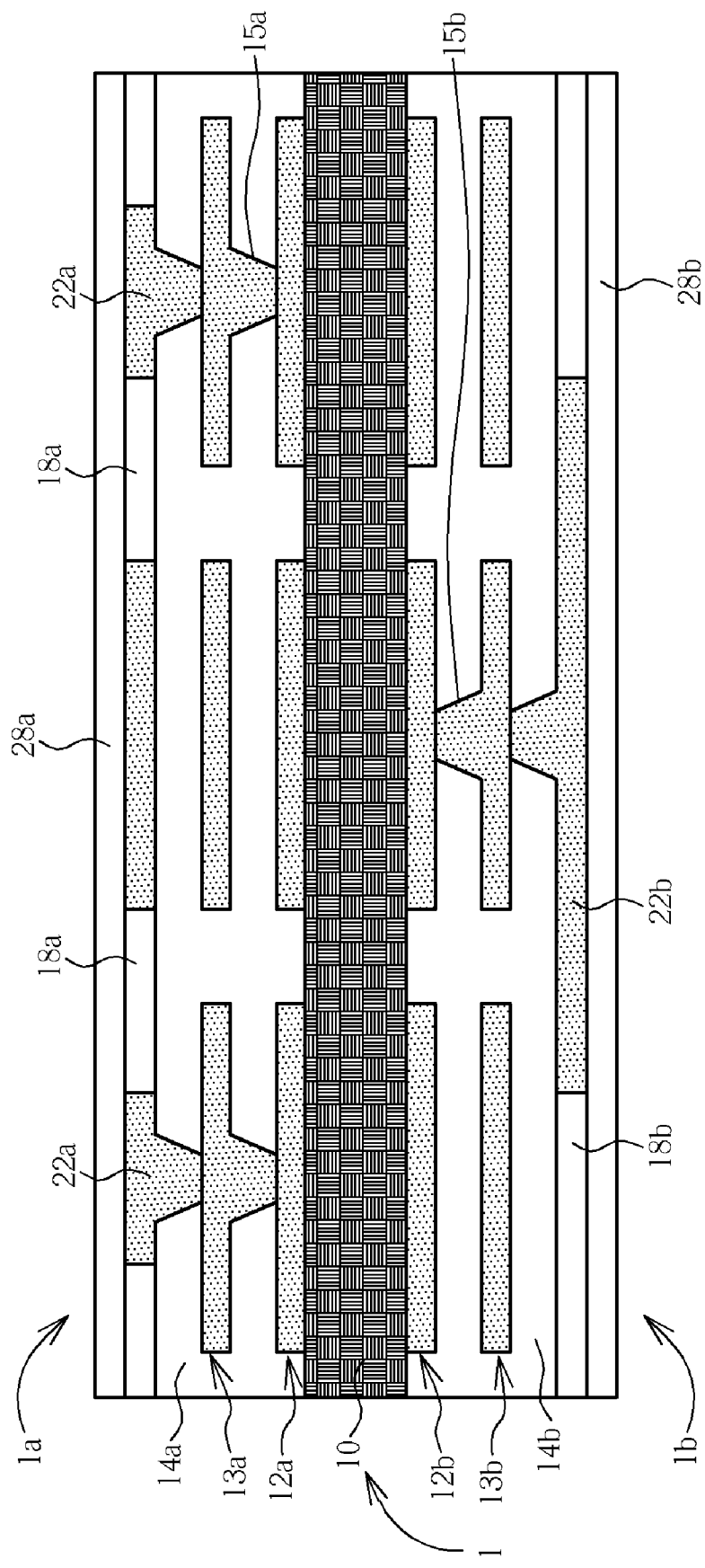

As shown in FIG. 14, a second dry film lamination process is performed to cover the first side 1a and second side 1b of the packaging substrate 1 with a photoresist dry film 28a and a photoresist dry film 28b respectively. The photoresist dry film 28a and the photoresist dry film 28b are laminated on the photoresist dry films 18a and 18b and the first metal layer 22a and 22b respectively.

Figure 15:
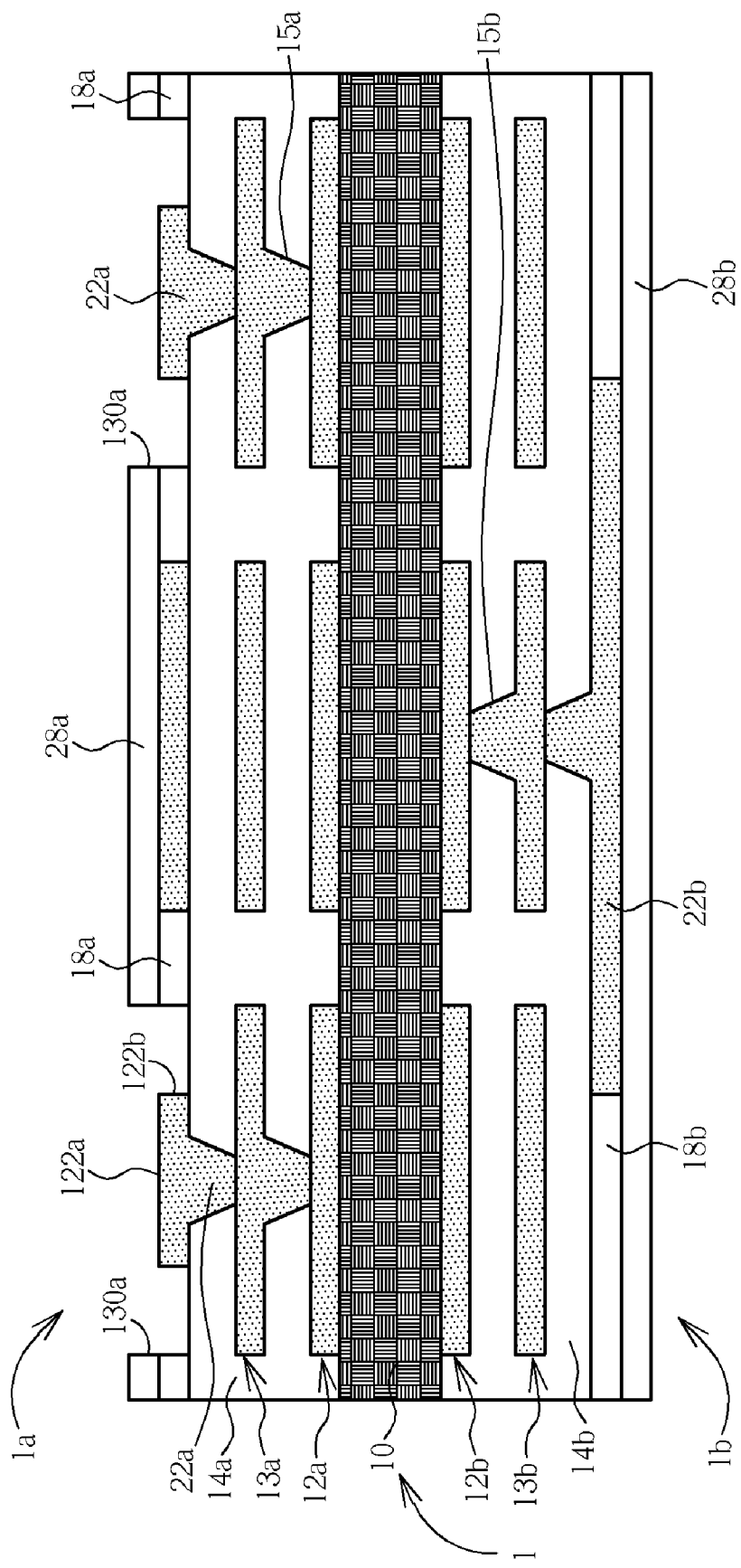

As shown in FIG. 15, the photoresist dry films 18a and 28a are subjected to a laser drilling process. Using the laser with pre-selected laser energy and wavelength, openings 130a are formed in the photoresist dry films 18a and 28a. The opening 130a is directly above the first metal layer 22a and exposes the top surface 122a and sidewall 122b of the first metal layer 22a.

The photoresist dry film 28a on the second side 1b of the packaging substrate 1 is intact and is not removed by the laser. According to the second preferred embodiment, the opening 130a defines the position and pattern of the solder pad that will be formed in the subsequent processes. One of the advantages of the second preferred embodiment is that one photo mask and lithographic process can be omitted.

Figure 16:
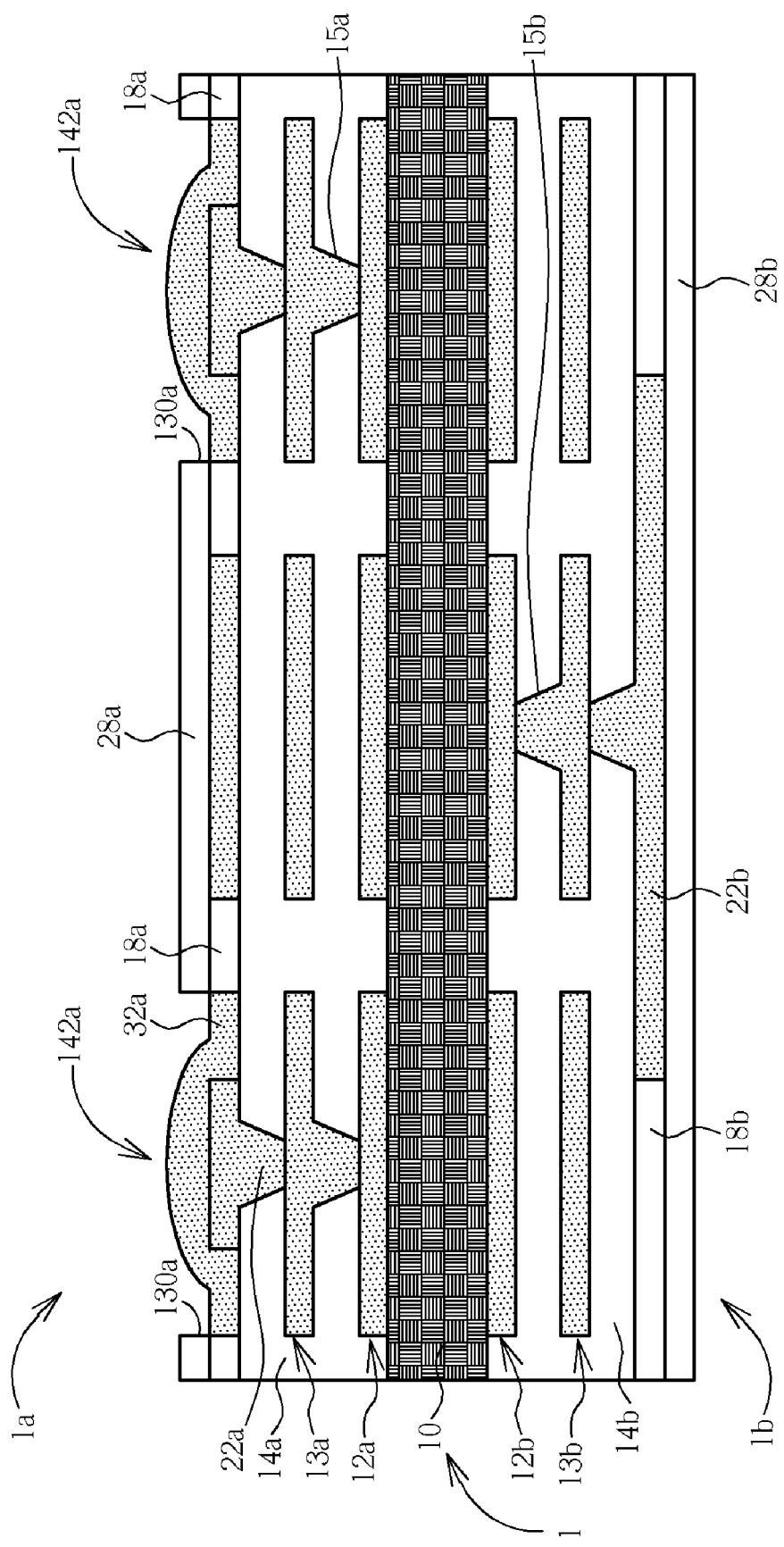

As shown in FIG. 16, another electroplating process is performed to fill the openings 130a with a second metal layer 32a, for example, copper, tin, silver, lead, gold or nickel, preferably copper. The second metal layer 32a is in direct contact with the first metal layer 22a and covers the top surface 122a and sidewall 122b of the first metal layer 22a, thereby forming a solder bump pad 142a.

Figure 17:
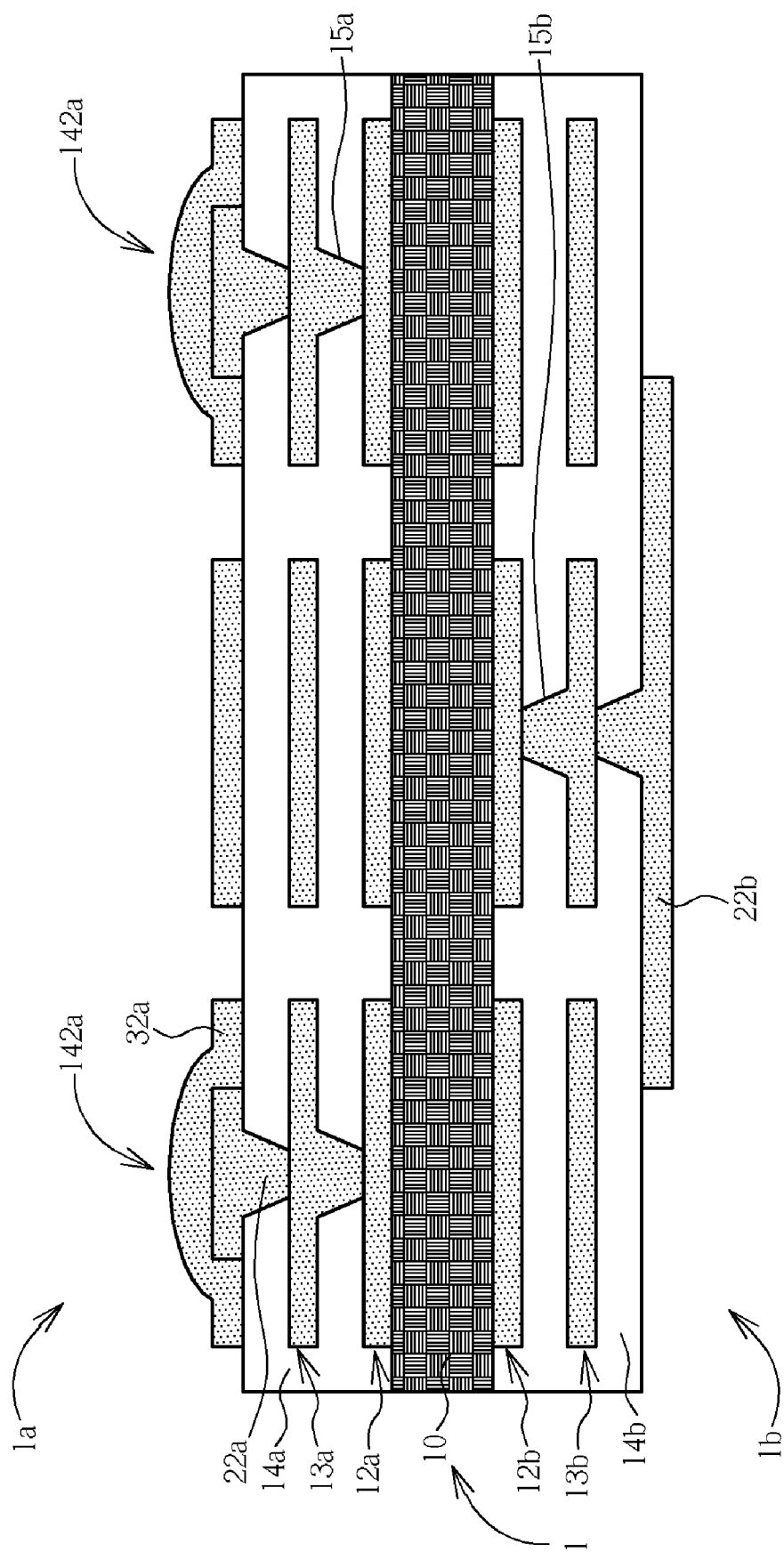

As shown in FIG. 17, after the electroplating of the second metal layer 32a, the photoresist dry films 28a and 28b and the photoresist dry films 18a and 18b are stripped off concurrently. At this point, the solder bump pad 142a consisting of the first metal layer 22a and the second metal layer 32a is formed on the first side 1a of the packaging substrate 1. The solder pad 142b on the second side 1b of the packaging substrate 1 only consists of the first metal layer 22b. After stripping the photoresist dry films, several post treatment steps are carried out, for example, ABF post bake, palladium removal and copper surface roughing.

Figure 18:
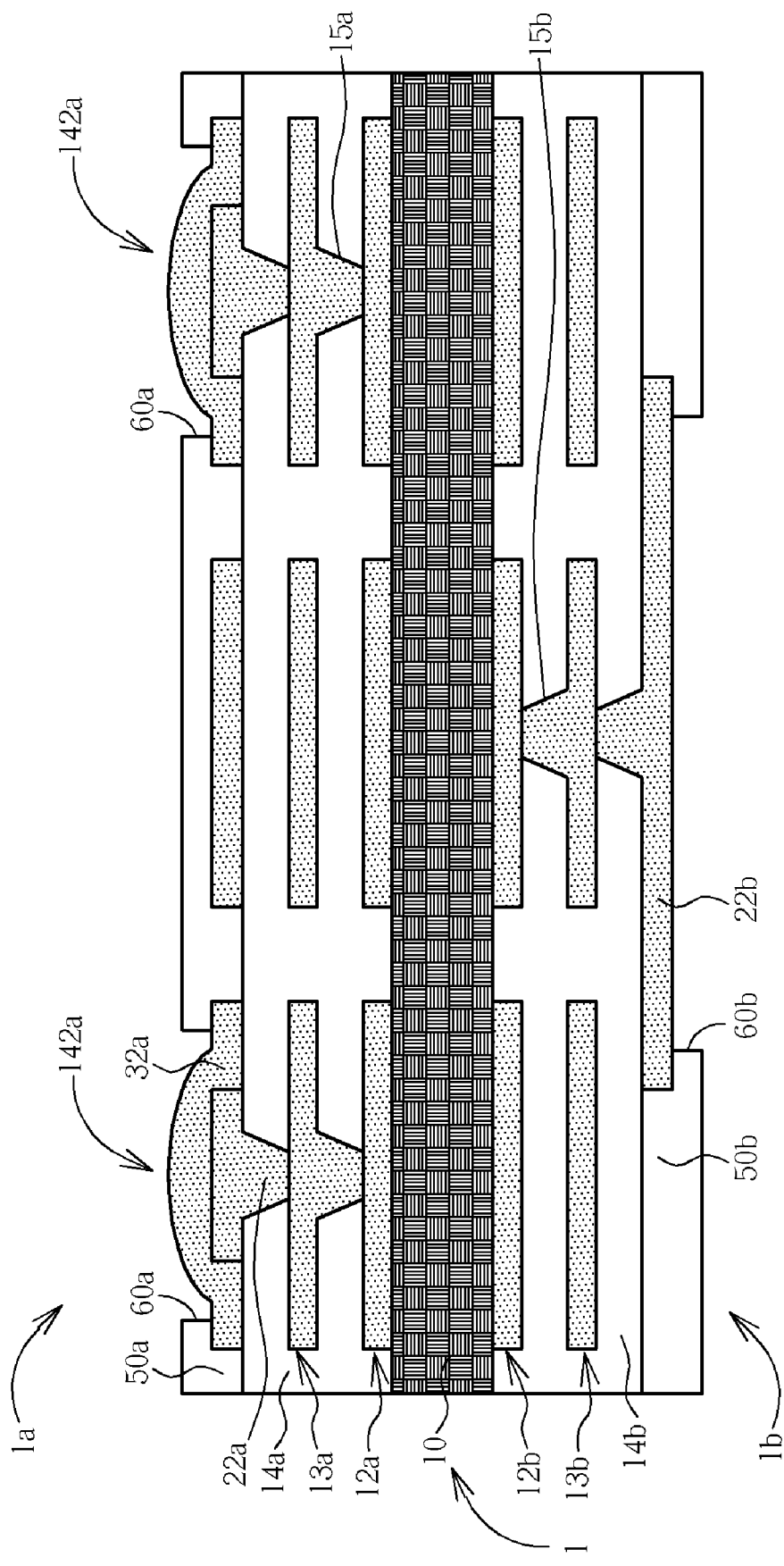

As shown in FIG. 18, a solder resist coating process is performed to coat solder resist layers 50a and 50b on the first side 1a and second side 1b of the packaging substrate 1. The solder resist layers 50a and 50b are composed of photosensitive materials.

The solder resist layers 50a and 50b are subjected to an exposure and development process to form S/R openings 60a and 60b in the solder resist layers 50a and 50b respectively. The S/R opening 60a is directly above the solder bump pad 142a and exposes a portion of the second metal layer 32a. The S/R opening 60b exposes a portion of the solder pad 142b. The remaining treatment includes de-smear and final surface treatment such as surface metal plating process.

The remaining treatment includes de-smear and final surface treatment such as surface metal plating process. The aforesaid final surface treatment may include deposition of material layer 62 such as chemical nickel gold, nickel silver, tin, silver or organic solder preservative (OSP) on the solder bump pad 142a or solder pad 142b.

Figure 19:
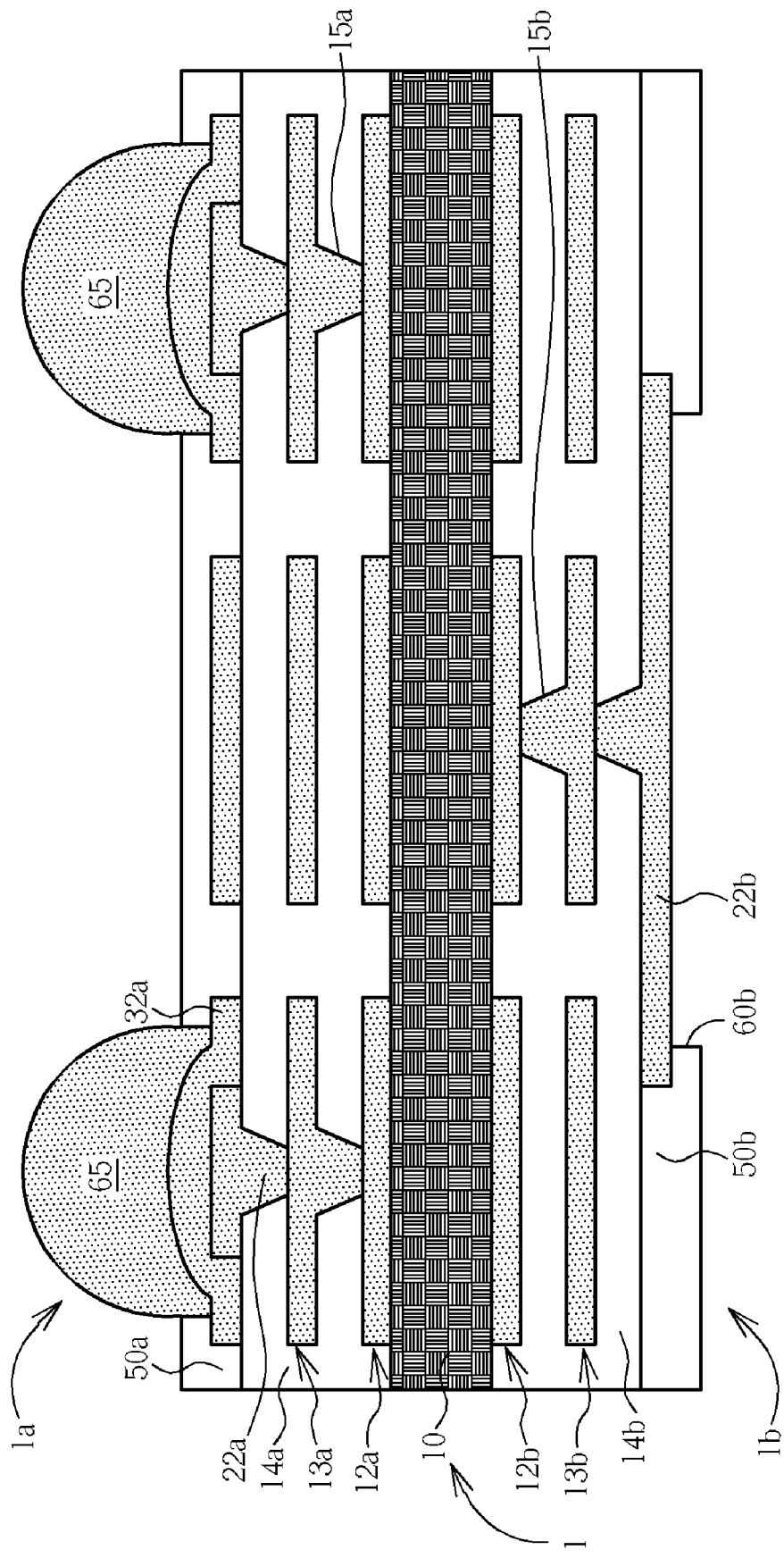

As shown in FIG. 19, a solder printing process and re-flow process are then carried out to form solder ball 65 on the solder bump pad 142a on the first side 1a of the packaging substrate 1.

Figure 20:
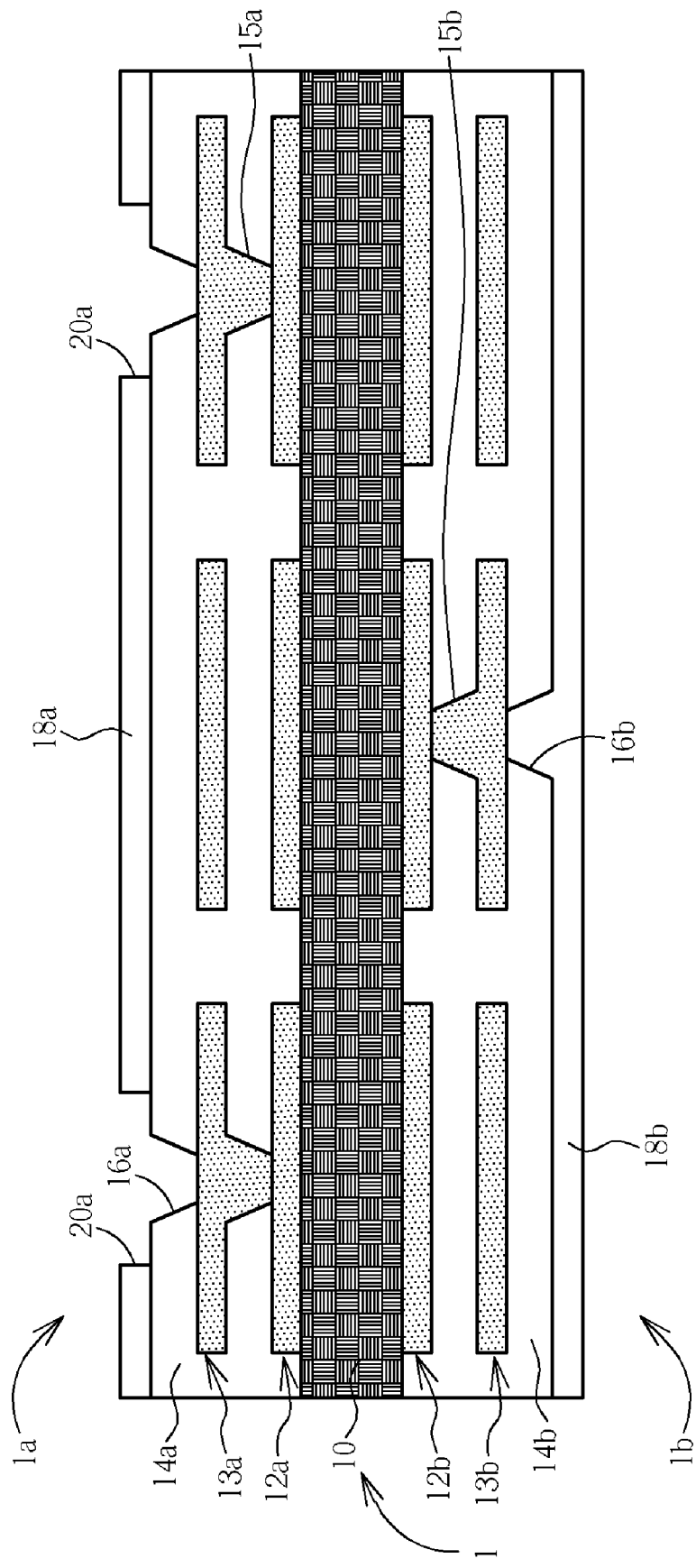
FIGS. 20-26 are schematic, cross-sectional diagrams illustrating the process for the fabrication of a packaging substrate in accordance with the third preferred embodiment of this invention.

FIGS. 20-26 are schematic, cross-sectional diagrams illustrating the process for the fabrication of a packaging substrate in accordance with the third preferred embodiment of this invention. As shown in FIG. 20, a packaging substrate 1 including a base substrate 10 is provided. Likewise, a plurality of metal conductors 12a, 12b, 13a and 13b, and insulating layers 14a and 14b are formed on the first side 1a and second side 1b of the packaging substrate 1. The metal conductors 12a, 12b, 13a and 13b may be formed by conventional additive methods including lithography, plating, film deposition, hole drilling, etc. The metal conductors 12a and 13a are connected through the conductive through hole 15a, and the metal conductors 12b and 13b are connected through the conductive through hole 15b.

The insulating layers 14a and 14b may be composed of at least one layer or multiple layers of Ajinomoto Build-up Film (ABF), BT, polyimide, or any other suitable thermosetting insulating materials. The through holes 16a and 16b are formed in the insulating layers 14a and 14b, respectively, by conventional drilling methods such as laser drilling methods. The through holes 16a and 16b expose portions of the underlying metal conductors 13a and 13b respectively. Solder pads will be formed directly above the through holes 16a and 16b.

Next, a first dry film lamination process is performed to cover the first side 1a and second side 1b of the packaging substrate 1 with a photoresist dry film 18a and a photoresist dry film 18b respectively. The photoresist dry film 18a and the photoresist dry film 18b are laminated on the insulating layer 14a and the insulating layer 14b respectively.

Prior to the lamination of the photoresist dry films 18a and 18b, a blanket conductive layer such as chemical copper layer (not shown) may be deposited on the insulating layer 14a and the insulating layer 14b.

An exposure and development process is carried out to form openings 20a merely in the photoresist dry film 18a. The opening 20a exposes the through hole 16a. It is noteworthy that after the exposure and development process, there is no opening formed in the photoresist dry film 18b.

Figure 21:
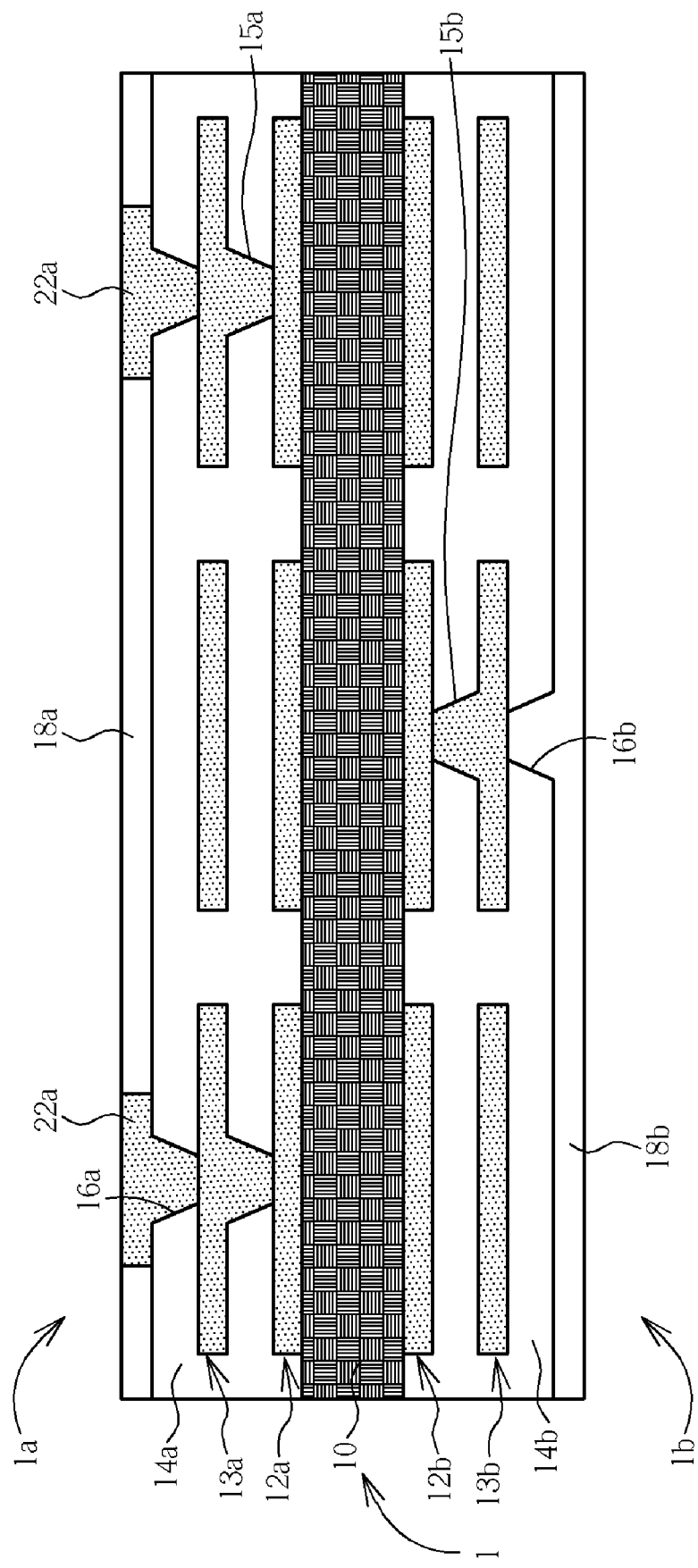

As shown in FIG. 21, an electroplating process is carried out to fill the opening 20a and the exposed through hole 16a with first metal layer 22a. The first metal layer 22a may be copper, tin, silver, lead, gold, nickel or alloys thereof, preferably copper. Since the second side 1b is covered by the photoresist dry film 18b, there is no metal plated thereon.

Figure 22:
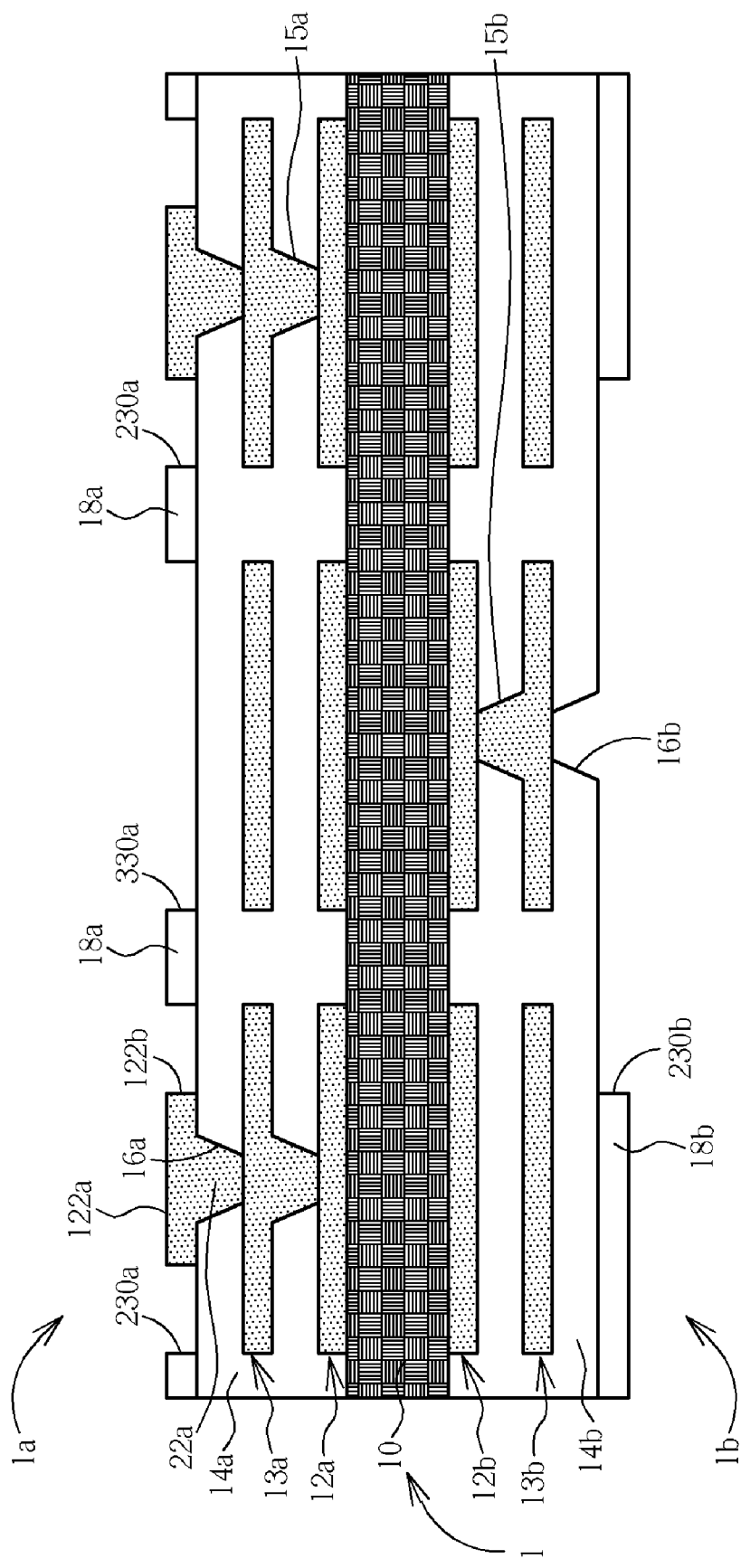

As shown in FIG. 22, the photoresist dry films 18a and 28a are subjected to a laser drilling process. Using the laser with pre-selected laser energy and wavelength, openings 230a and 330a are formed in the photoresist dry film 18a and opening 230b is formed in the photoresist dry film 18b. The opening 230a is directly above the first metal layer 22a and exposes the top surface 122a and sidewall 122b of the first metal layer 22a. The openings 230a and 230b define the position and pattern of the solder pad to be formed.

The opening 330a in the photoresist dry film 18a defines the third level circuit pattern on the first side 1a of the packaging substrate 10. Comparing to the second preferred embodiment, the third preferred embodiment saves photoresist dry films because the solder pad pattern is defined only using one single layer of photoresist dry film on the first side 1a.

Figure 23:
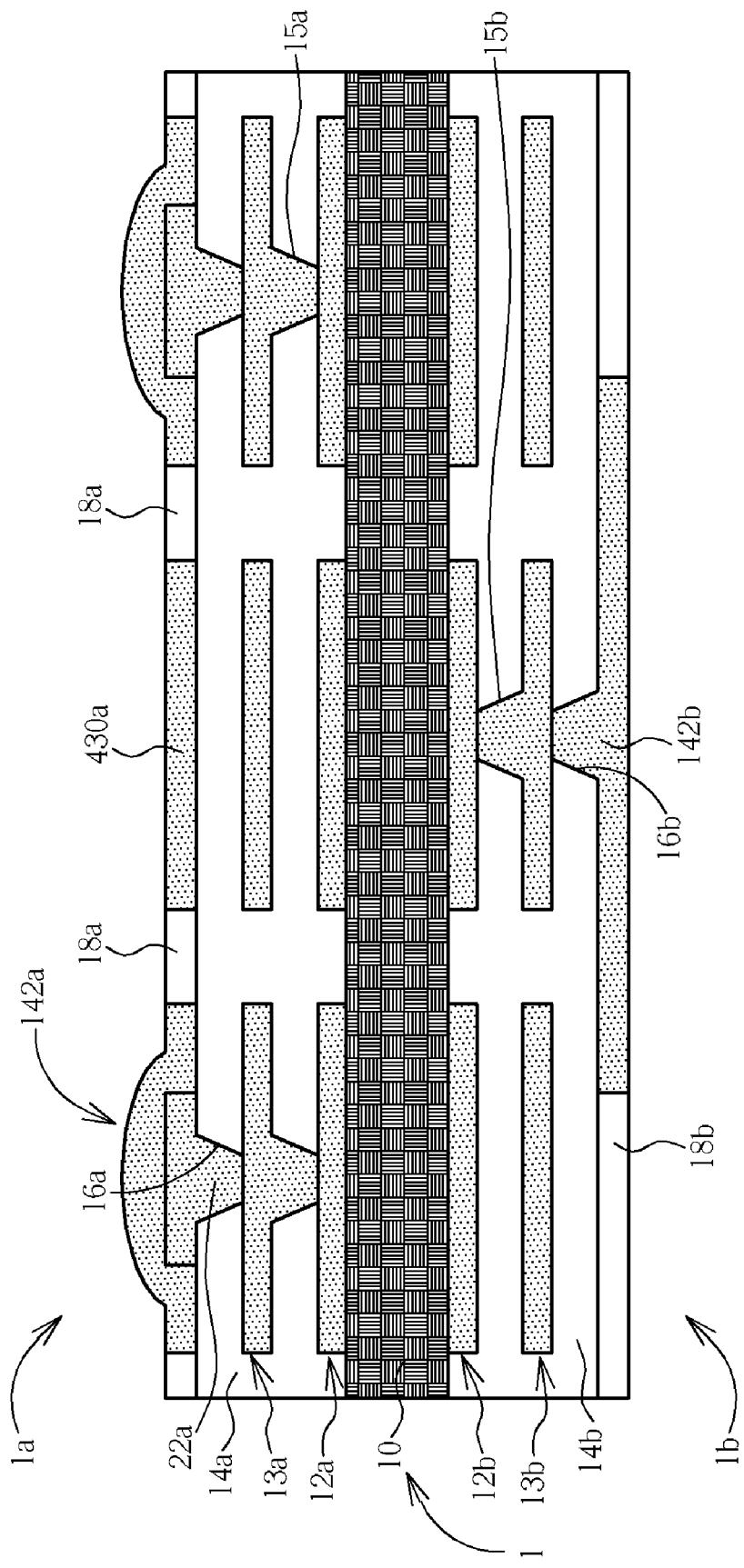

As shown in FIG. 23, an electroplating process is carried out to fill the openings 230a, 230b and 330a with metal such as copper, tin, silver, lead, gold, nickel or alloys thereof, preferably copper, thereby forming solder bump pad 142a, solder bump pad 142b and wire 430a.

Figure 24:
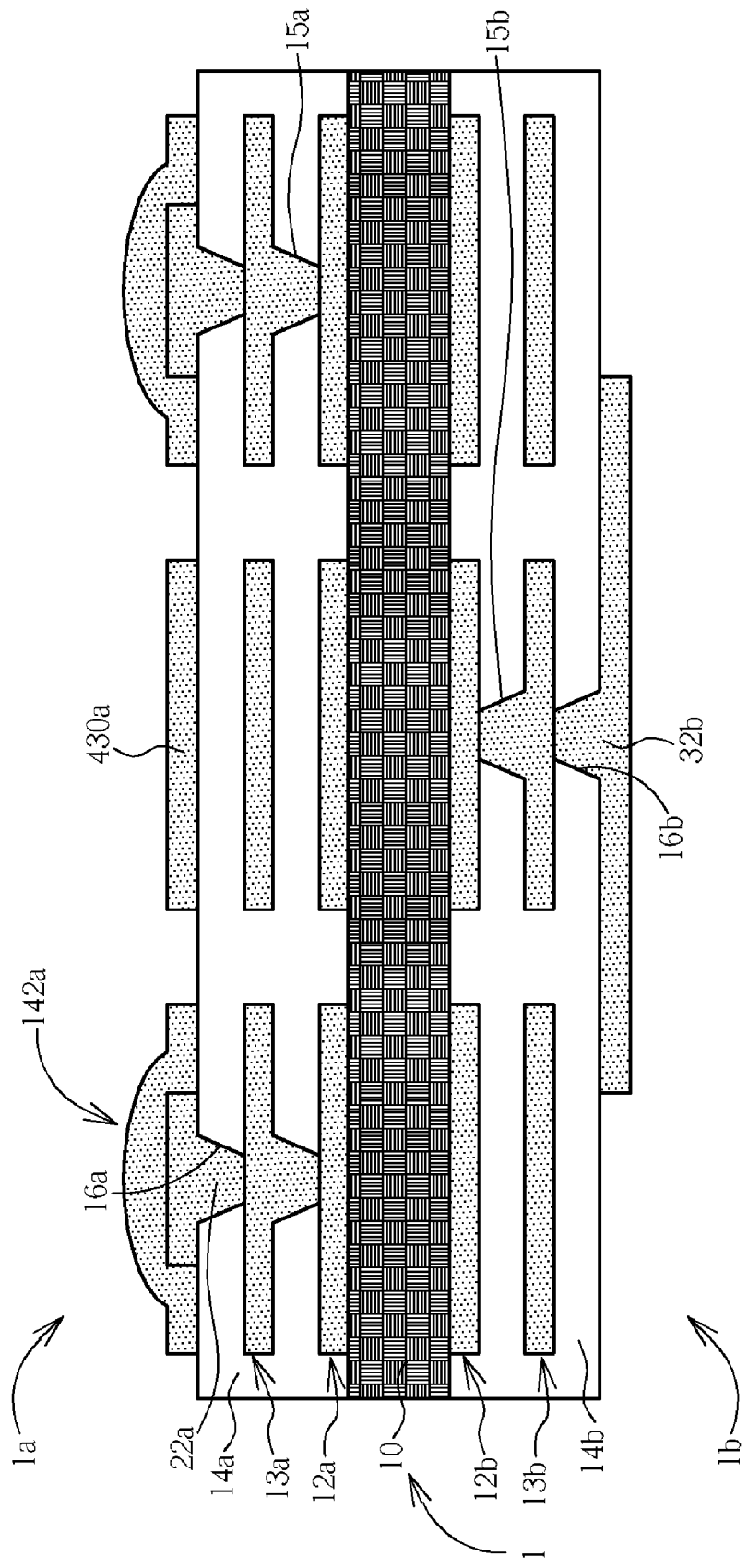

As shown in FIG. 24, the photoresist dry films 18a and 18b are stripped off. After stripping the photoresist dry films, several post treatment steps are carried out, for example, ABF post bake, palladium removal and copper surface roughing.

Figure 25:
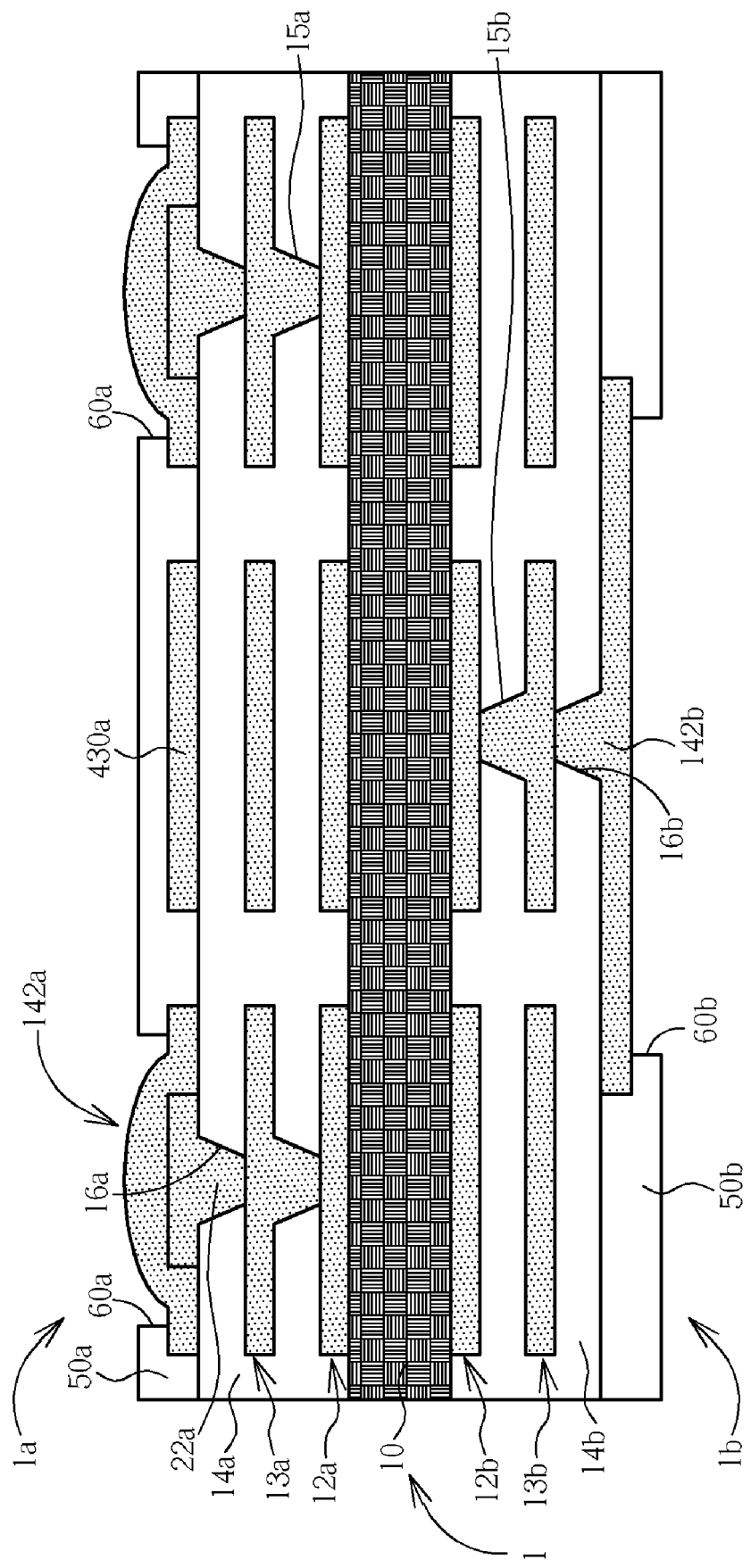

As shown in FIG. 25, a solder resist coating process is performed to coat solder resist layers 50a and 50b on the first side 1a and second side 1b of the packaging substrate 1. The solder resist layers 50a and 50b are composed of photosensitive materials. The solder resist layers 50a and 50b are subjected to an exposure and development process to form S/R openings 60a and 60b in the solder resist layers 50a and 50b respectively.

The S/R opening 60a is directly above the solder bump pad 142a and exposes a portion of the solder bump pad 142a. The S/R opening 60b exposes a portion of the solder pad 142b. The wire 430a is covered by the solder resist layers 50a.

The remaining treatment includes de-smear and final surface treatment such as surface metal plating process. The aforesaid final surface treatment may include deposition of material layer such as chemical nickel gold, nickel silver, tin, silver or organic solder preservative (OSP) on the solder bump pad 142a or solder pad 142b.

Figure 26:
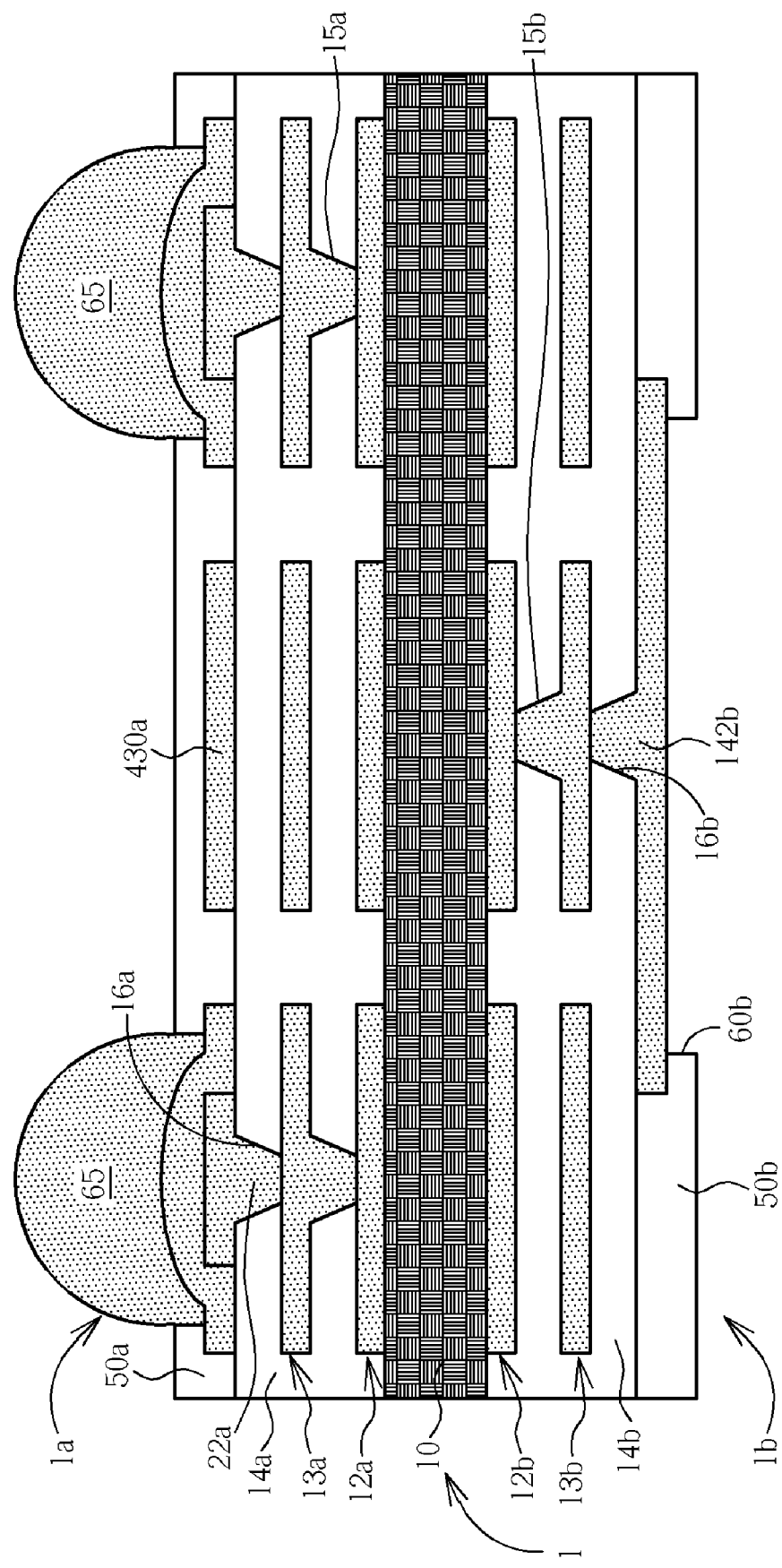

As shown in FIG. 26, a solder printing process and re-flow process are then carried out to form solder ball 65 on the solder bump pad 142a on the first side 1a of the packaging substrate 1.

Those skilled in the art will readily observe that numerous modifications and alterations of the device and method may be made while retaining the teachings of the invention.

What is claimed is:

1. A solder pad structure comprising:
   a first metal layer on an insulating layer;
   a second metal layer stacked on said first metal layer, wherein said second metal layer directly contacts said first metal layer and constitutes a bump structure on said first metal layer;
   a solder resist layer covering said insulating layer and bordering a periphery of said first metal layer, said solder resist layer comprising at least one solder resist opening for exposing a portion of said first metal layer; and
   a solder ball in said solder resist opening wherein said solder ball contacts with said first and second metal layers.

2. The solder pad structure according to claim 1 wherein said solder resist opening is filled with said solder ball.

3. The solder pad structure according to claim 1 wherein said solder resist opening has a diameter of 10-85 micrometers.

4. The solder pad structure according to claim 3 wherein said solder resist opening has a diameter of 20-70 micrometers.

5. The solder pad structure according to claim 4 wherein said second meta layer has a width of ⅓-¼ said diameter of said solder resist opening.

6. The solder pad structure according to claim 1 wherein said solder resist opening has adepth of 15-35 micrometers.

7. The solder pad structure according to claim 6 wherein said solder resist opening has a depth of 20-30 micrometers.

8. The solder pad structure according to claim 1 wherein said first metal layer is composed of metals or alloys.

9. The solder pad structure according to claim 8 wherein said first metal layer comprises copper, tin, silver, lead, gold, nickel, chrome or alloys thereof.

10. The solder pad structure according to claim 1 wherein said second metal layer is composed of metals or alloys.

11. The solder pad structure according to claim 10 wherein said second metal layer comprises copper, tin, silver, lead, gold, nickel, chrome or alloys thereof.

12. The solder pad structure according to claim 1 wherein said second metal layer has a thickness of 10-30 micrometers.

13. The solder pad structure according to claim 12 wherein said second metal layer has a thickness of 15-20 micrometers.

14. The solder pad structure according to claim 1 wherein said insulating layer comprises thermosetting resin.

15. The solder pad structure according to claim 14 wherein said thermosetting resin comprises epoxy or polyimide.

16. The solder pad structure according to claim 15 wherein said thermosetting resin is epoxy.

17. The solder pad structure according to claim 16 wherein said epoxy comprises ABF resin and BT resin.

18. The solder pad structure according to claim 17 wherein said epoxy is ABF resin.

19. The solder pad structure according to claim 1 wherein a material layercomprising chemical nickel gold, nickel silver, tin, silver and organic solder preservative (OSP) is formed on the solder pad structure.

* * * * *

UNITED STATES PATENT AND TRADEMARK OFFICE
CERTIFICATE OF CORRECTION

PATENT NO.        : 7,521,800 B2
APPLICATION NO.   : 11/752934
DATED             : April 21, 2009
INVENTOR(S)       : Chih-Chung Chu et al.

It is certified that error appears in the above-identified patent and that said Letters Patent is hereby corrected as shown below:

Claim 5, column 8, line 31, "meta" should read as --metal--.

Signed and Sealed this

Twenty-second Day of September, 2009

David J. Kappos
*Director of the United States Patent and Trademark Office*